United States Patent
Kato

(10) Patent No.: US 8,787,741 B2
(45) Date of Patent: Jul. 22, 2014

(54) HEAT TREATMENT METHOD AND HEAT TREATMENT APPARATUS FOR HEATING SUBSTRATE BY LIGHT IRRADIATION

(75) Inventor: Shinichi Kato, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 109 days.

(21) Appl. No.: 13/362,555

(22) Filed: Jan. 31, 2012

(65) Prior Publication Data

US 2012/0128336 A1    May 24, 2012

Related U.S. Application Data

(62) Division of application No. 12/732,591, filed on Mar. 26, 2010, now Pat. No. 8,129,284.

(30) Foreign Application Priority Data

Apr. 28, 2009 (JP) ................................. 2009-109318
Jan. 29, 2010 (JP) ................................. 2010-018128

(51) Int. Cl.
*F27B 5/14* (2006.01)
*F27B 5/16* (2006.01)
*F27D 7/06* (2006.01)
*H01L 21/00* (2006.01)
*H01L 21/302* (2006.01)

(52) U.S. Cl.
USPC ........... 392/416; 392/411; 219/411; 438/795; 118/725; 118/50.1

(58) Field of Classification Search
None
See application file for complete search history.

(56) References Cited

U.S. PATENT DOCUMENTS

| | | | |
|---|---|---|---|
| 6,885,815 B2 * | 4/2005 | Kusuda et al. | 392/416 |
| 6,936,797 B2 | 8/2005 | Hosokawa | |
| 6,998,580 B2 | 2/2006 | Kusuda et al. | |
| 7,101,753 B2 * | 9/2006 | Kamiyama et al. | 438/240 |
| 7,115,837 B2 * | 10/2006 | Timans et al. | 219/405 |
| 7,183,229 B2 * | 2/2007 | Yamanaka | 438/795 |
| 7,317,870 B2 * | 1/2008 | Timans et al. | 392/416 |
| 7,323,401 B2 * | 1/2008 | Ramaswamy et al. | 438/551 |

(Continued)

FOREIGN PATENT DOCUMENTS

| | | |
|---|---|---|
| JP | 61-075517 | 4/1986 |
| JP | 62-128517 | 6/1987 |

(Continued)

OTHER PUBLICATIONS

JP 2003-059854 A, Ito et al, Feb. 2003, partial translation.*

(Continued)

*Primary Examiner* — Joseph M Pelham
(74) *Attorney, Agent, or Firm* — Ostrolenk Faber LLP

(57) ABSTRACT

A semiconductor wafer in which a carbon thin film is formed on a surface of a silicon substrate implanted with impurities is irradiated with flash light emitted from flash lamps. Absorbing the flash light causes the temperature of the carbon thin film to increase. The surface temperature of the silicon substrate implanted with impurities is therefore increased to be higher than that in a case where no thin film is formed, and the sheet resistance value can be thereby decreased. When the semiconductor wafer with the carbon thin film formed thereon is irradiated with flash light in high concentration oxygen atmosphere, since the carbon of the thin film is oxidized to be vaporized, removal of the thin film is performed concurrently with flash heating.

7 Claims, 22 Drawing Sheets

(56) References Cited

U.S. PATENT DOCUMENTS

| | | | |
|---|---|---|---|
| 7,381,928 B2 | 6/2008 | Kusuda et al. | |
| 7,393,417 B1 | 7/2008 | Maeda et al. | |
| 7,445,382 B2* | 11/2008 | Camm et al. | 374/121 |
| 7,616,872 B2* | 11/2009 | Camm et al. | 392/416 |
| 7,642,205 B2* | 1/2010 | Timans | 438/795 |
| 7,758,238 B2* | 7/2010 | Govindaraju et al. | 374/123 |
| 8,005,351 B2* | 8/2011 | Camm et al. | 392/416 |
| 8,129,284 B2* | 3/2012 | Kato | 438/715 |
| 2003/0013280 A1* | 1/2003 | Yamanaka | 438/487 |
| 2004/0008980 A1* | 1/2004 | Morimoto et al. | 392/418 |
| 2005/0047767 A1 | 3/2005 | Nozaki | |
| 2005/0063453 A1* | 3/2005 | Camm et al. | 374/161 |
| 2005/0260838 A1 | 11/2005 | Downey et al. | |
| 2006/0228897 A1* | 10/2006 | Timans | 438/758 |
| 2006/0260545 A1 | 11/2006 | Ramaswamy et al. | |
| 2007/0032054 A1 | 2/2007 | Ramaswamy et al. | |
| 2008/0069550 A1* | 3/2008 | Timans et al. | 392/411 |
| 2008/0214020 A1 | 9/2008 | Ito et al. | |
| 2008/0273867 A1* | 11/2008 | Camm et al. | 392/416 |
| 2009/0103906 A1* | 4/2009 | Kusuda | 392/418 |
| 2009/0120924 A1 | 5/2009 | Moffatt et al. | |
| 2009/0121157 A1 | 5/2009 | Moffatt et al. | |
| 2009/0137107 A1 | 5/2009 | Itani | |
| 2009/0323759 A1* | 12/2009 | Govindaraju et al. | 374/123 |
| 2010/0099268 A1* | 4/2010 | Timans | 438/761 |
| 2010/0273333 A1* | 10/2010 | Kato | 438/795 |
| 2010/0297856 A1 | 11/2010 | Moffatt et al. | |
| 2011/0274417 A1* | 11/2011 | Camm et al. | 392/411 |
| 2012/0093492 A1* | 4/2012 | Kato et al. | 392/411 |
| 2012/0288261 A1* | 11/2012 | Hashimoto et al. | 392/416 |

FOREIGN PATENT DOCUMENTS

| | | |
|---|---|---|
| JP | 10-025200 | 1/1998 |
| JP | 10-070313 | 3/1998 |
| JP | 2001-126995 | 5/2001 |
| JP | 2003-059854 | 2/2003 |
| JP | 2004-022837 | 1/2004 |
| JP | 2004-55821 | 2/2004 |
| JP | 2004-88052 | 3/2004 |
| JP | 2005-032998 | 2/2005 |
| JP | 2005-072291 | 3/2005 |
| JP | 2006-503422 | 1/2006 |
| JP | 2007-048892 | 2/2007 |
| JP | 2008-027988 | 2/2008 |
| JP | 2008-192924 | 8/2008 |
| JP | 2008-244329 | 10/2008 |
| JP | 2008-546179 | 12/2008 |
| JP | 2008-546179 A | 12/2008 |
| JP | 2009-130243 | 6/2009 |
| JP | 2009-188378 | 8/2009 |

OTHER PUBLICATIONS

Office Action issued by Japanese Patent Office on Nov. 19, 2013 in connection with corresponding Japanese Patent Application No. 2010-018128 and English Translation thereof.

Japanese Office Action dated Dec. 17, 2013 issued in corresponding Japanese Patent Application No. JP2009-109318 (Partial English translation. Portions relevant to prior-art based rejections are translated.).

Office Action issued by Japanese Patent Office on Sep. 24, 2013 in connection with corresponding Japanese Patent Application No. 2009-109318 and English Translation thereof.

* cited by examiner

F I G. 1
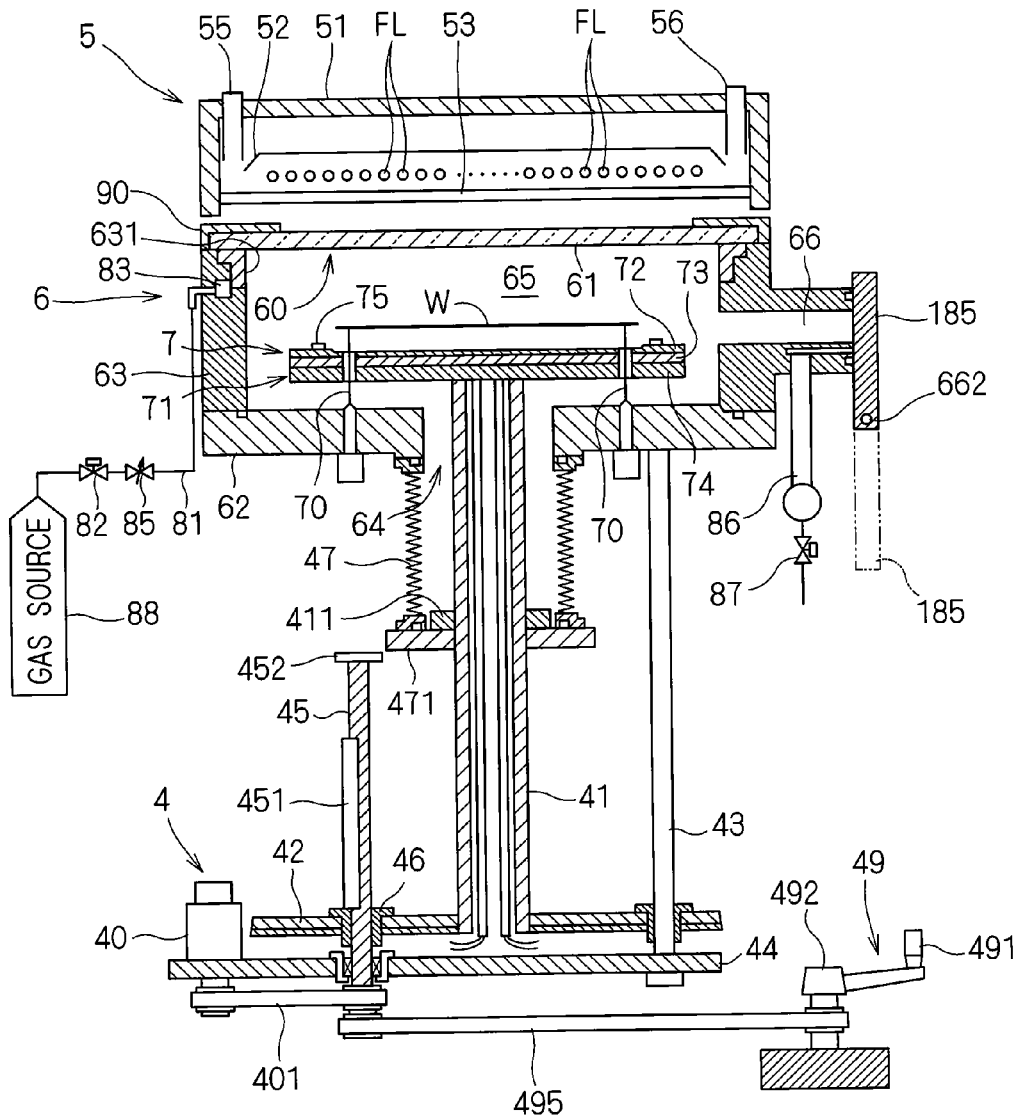

F I G . 2
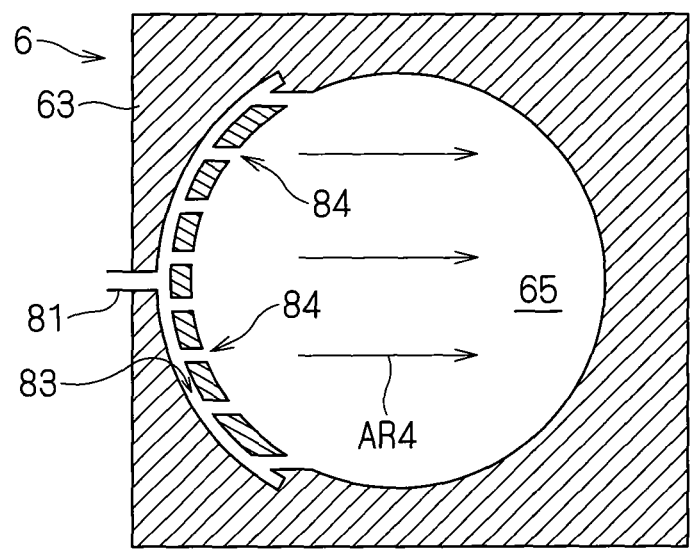

F I G. 3
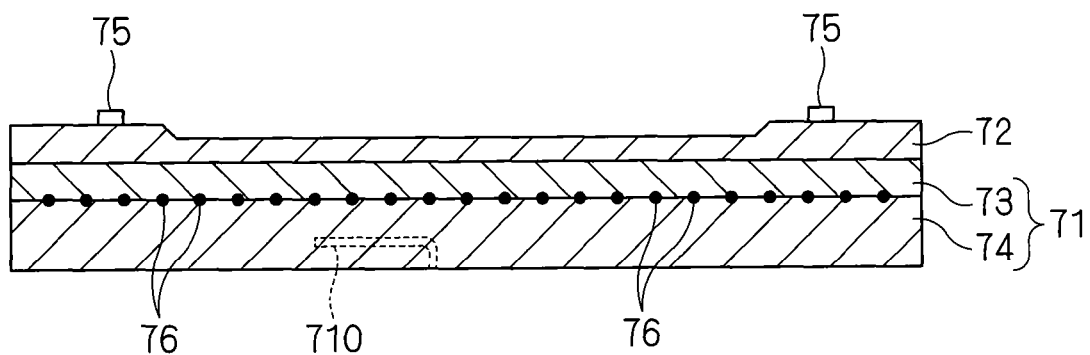

F I G. 4
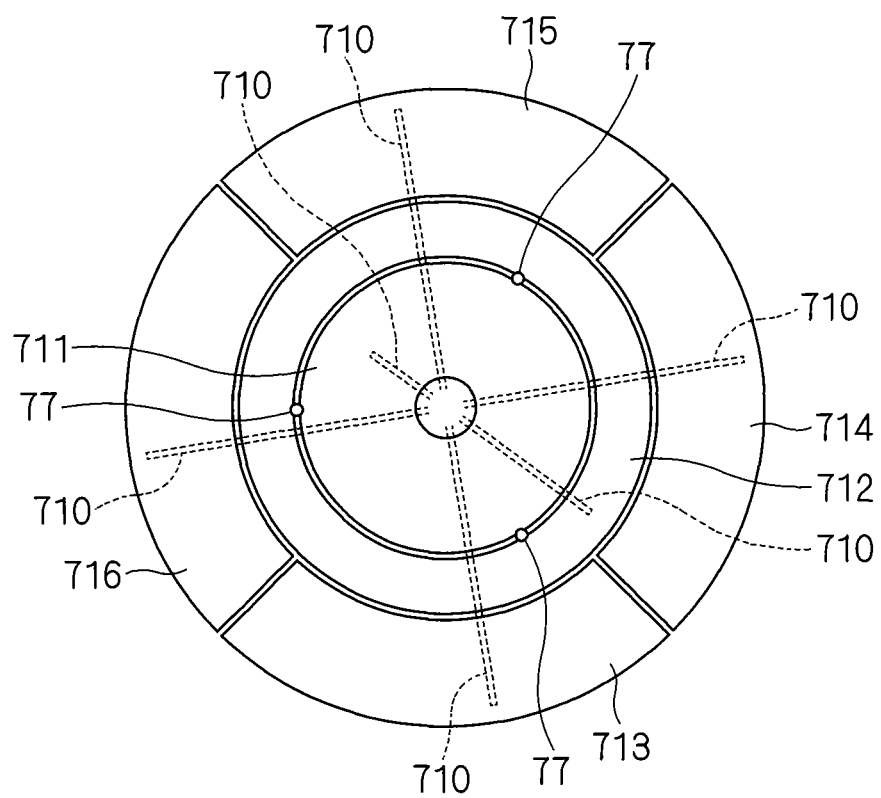

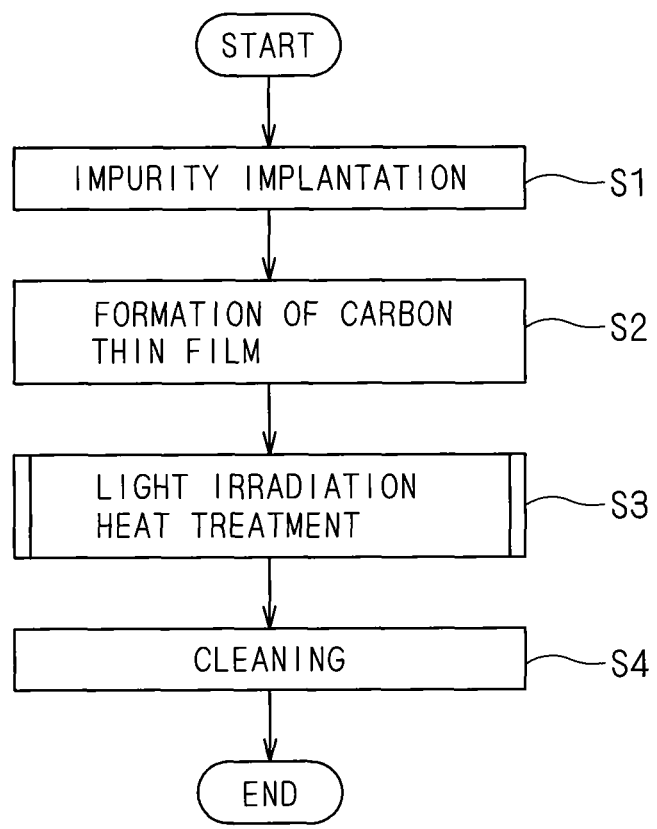
F I G . 7

F I G . 1 1
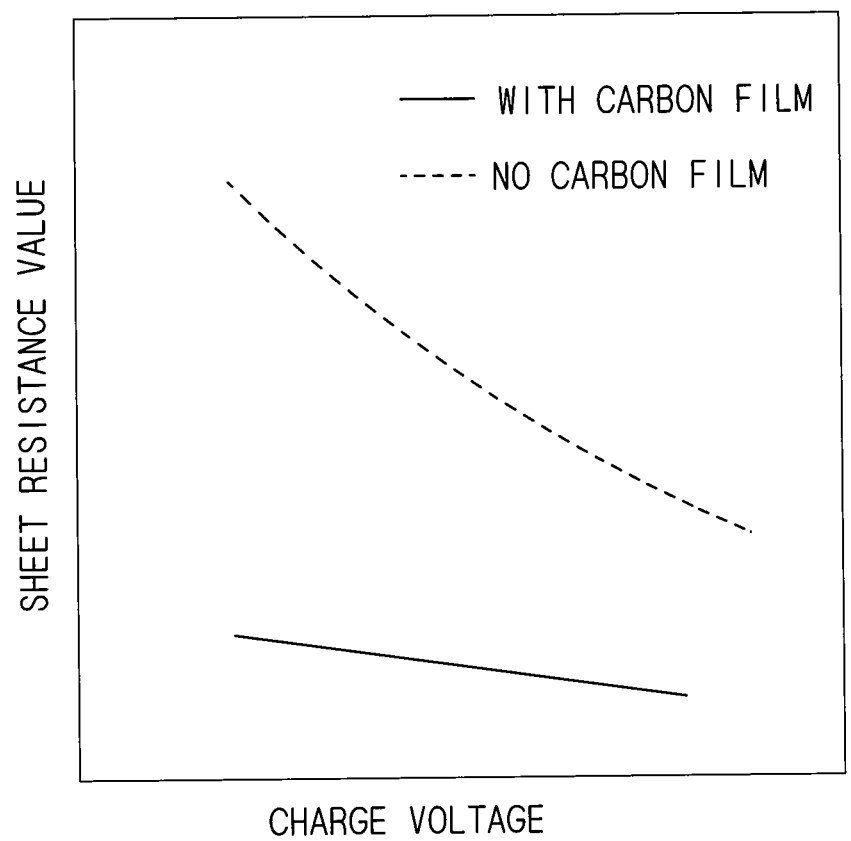

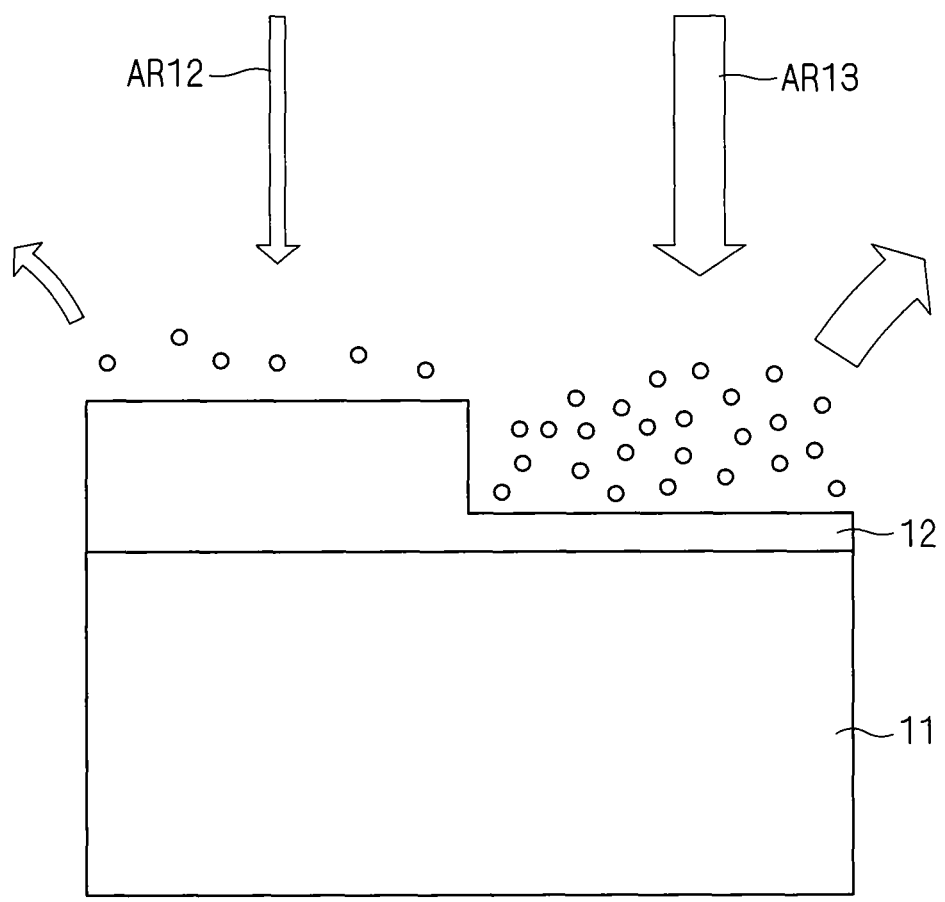

FIG. 13
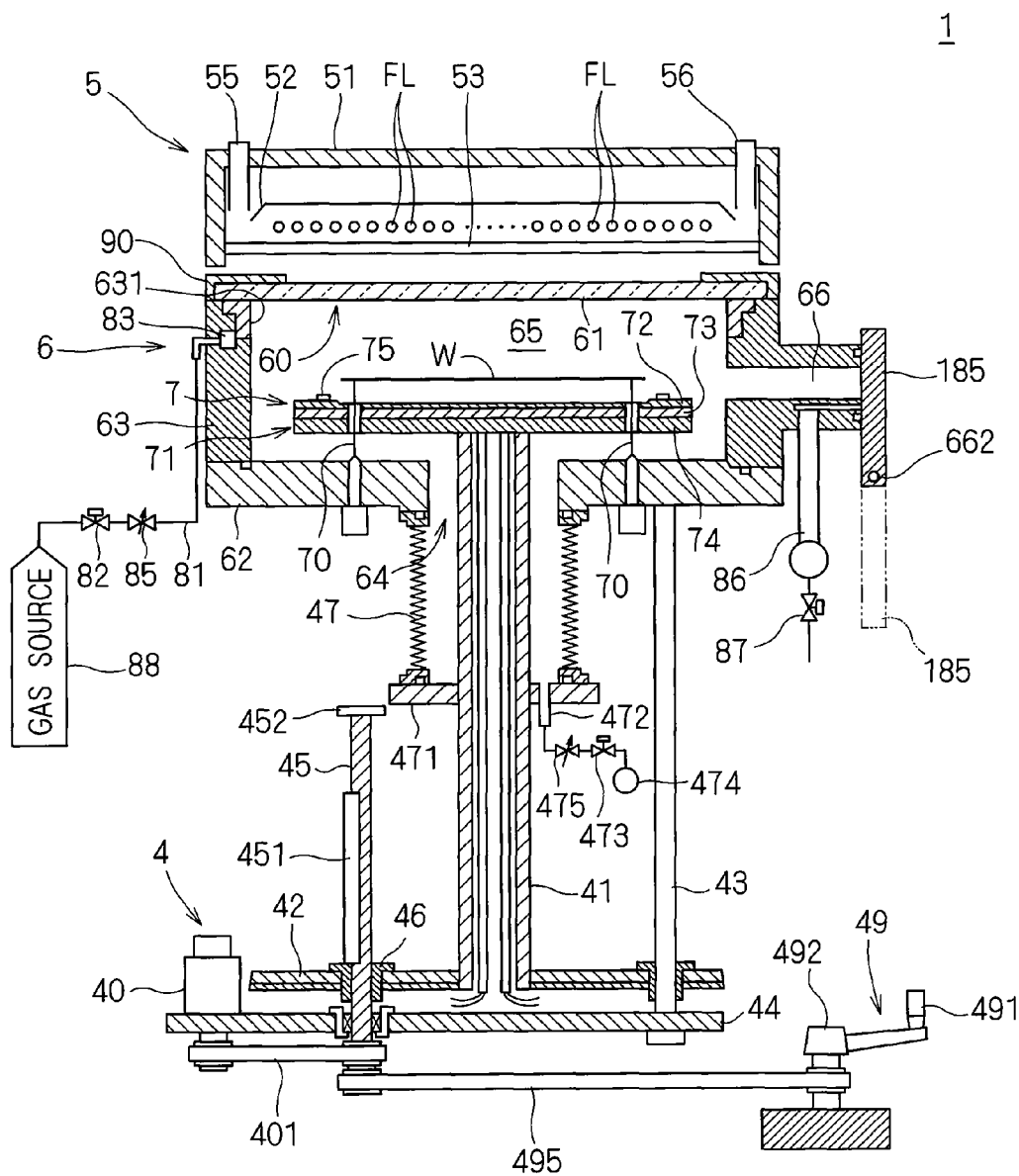
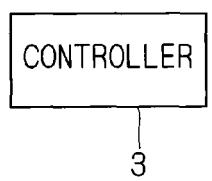

F I G . 1 5
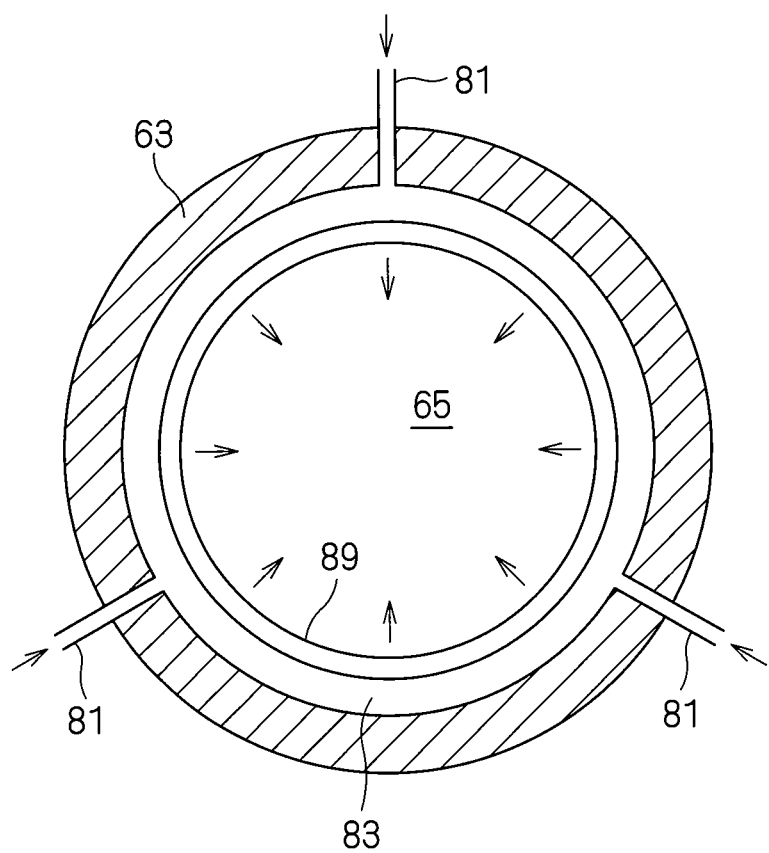

F I G . 2 0
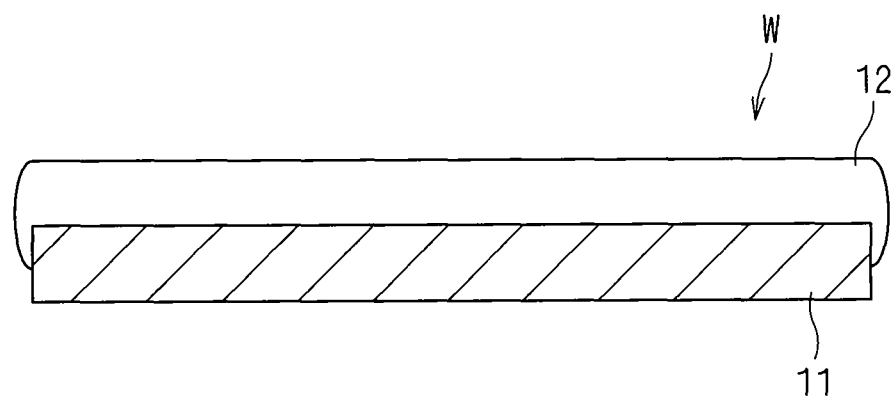

F I G . 2 1
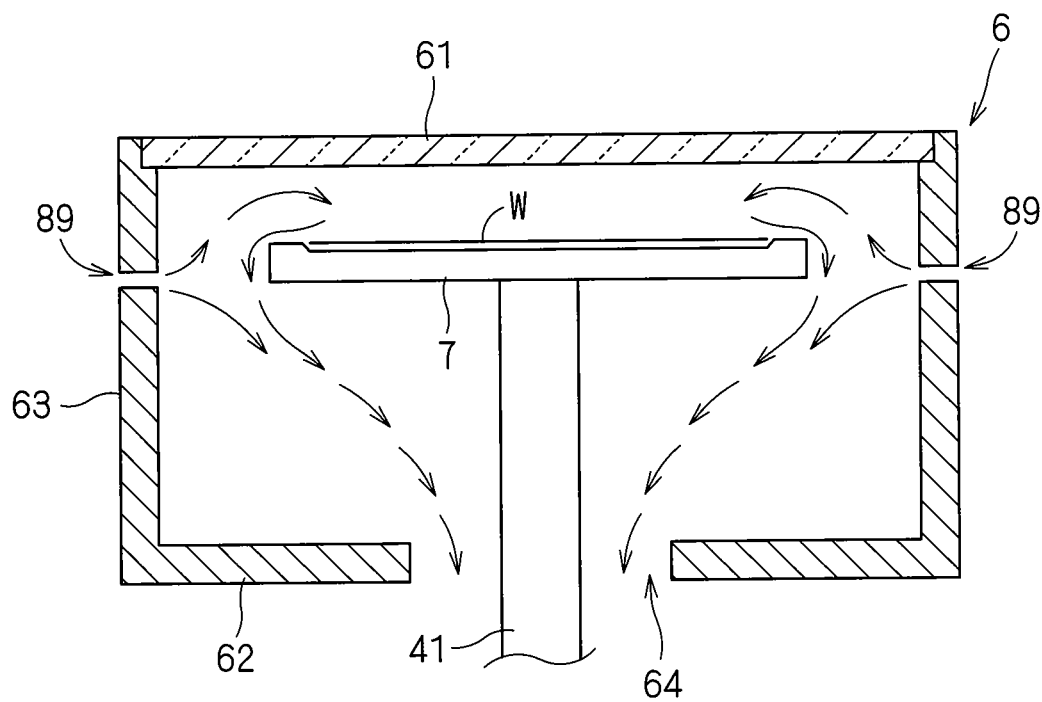

F I G . 2 2
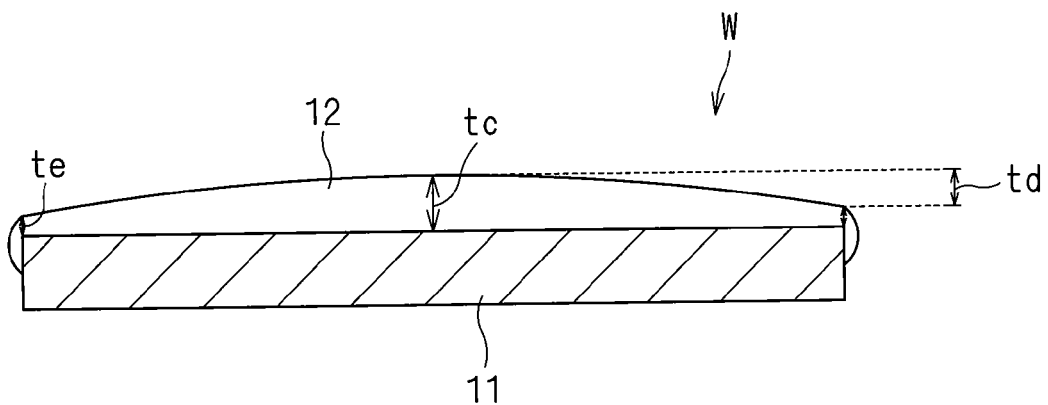

F I G. 2 3
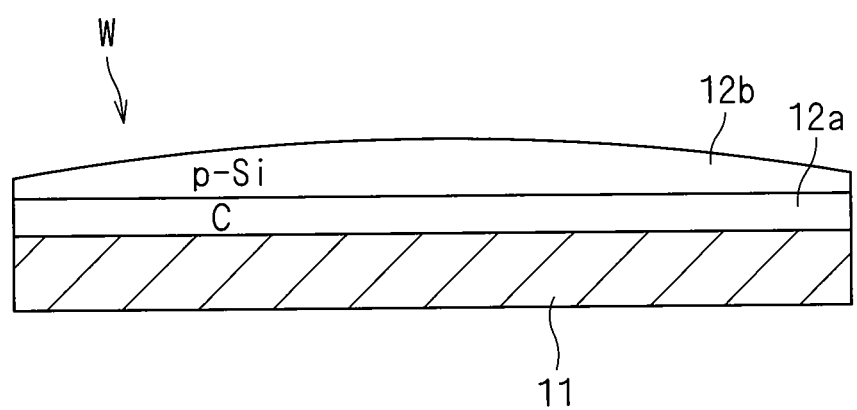

HEAT TREATMENT METHOD AND HEAT TREATMENT APPARATUS FOR HEATING SUBSTRATE BY LIGHT IRRADIATION

CROSS REFERENCE TO RELATED APPLICATION

This application is a divisional of U.S. application Ser. No. 12/732,591, filed Mar. 26, 2010, by Shinichi KATO, entitled HEAT TREATMENT METHOD AND HEAT TREATMENT APPARATUS FOR HEATING SUBSTRATE BY LIGHT IRRADIATION which claims the benefit of Japanese Appln. S.N. JP2009-109318, filed Apr. 28, 2009 and Japanese Appln. No. JP2010-018128, filed Jan. 29, 2010, the contents of which are incorporated by this reference.

BACKGROUND OF THE INVENTION

1. Field of the Invention

The present invention relates to a heat treatment method and a heat treatment apparatus both of which are used for heating a thin plate-like precision electronic substrate such as a semiconductor wafer, a glass substrate for a liquid crystal display device, a glass substrate for a photomask and a substrate for an optical disk (hereinafter referred to simply as a "substrate"), which is implanted with impurities, by irradiating the substrate with flash light.

2. Description of the Background Art

Conventionally, a lamp annealer employing halogen lamps has been commonly used in the step of activating impurities in a semiconductor wafer after impurity implantation. Such a lamp annealer carries out the activation of impurities in a semiconductor wafer by heating (or annealing) the semiconductor wafer up to a temperature of, e.x., about 1000° C. to 1100° C. In such a heat treatment apparatus, the energy of light emitted from halogen lamps is used to raise the temperature of a substrate at a rate of about several hundred degrees per second.

Meanwhile, in recent years, with increasing degree of integration of semiconductor devices, it has been desired that the junction should be made shallower as the gate length is shortened. It has turned out, however, that even if the above lamp annealer, which raises the temperature of a semiconductor wafer at a rate of about several hundred degrees per second, is used to carry out the activation of impurities in a semiconductor wafer, there still occurs a phenomenon that impurities such as boron or phosphorous implanted in the semiconductor wafer are deeply diffused by heat. There is apprehension that the occurrence of such a phenomenon may cause the depth of the junction to exceed the required level, thereby hindering good device formation.

To solve the problem, U.S. Pat. No. 6,998,580 and U.S. Pat. No. 6,936,797 propose techniques for raising only the surface temperature of a semiconductor wafer implanted with impurities in an extremely short period of time (several milliseconds or less) by irradiating the surface of the semiconductor wafer with flashes of light from xenon flash lamps (the term "flash lamp" as used hereinafter refers to a "xenon flash lamp"). The xenon flash lamps have a spectral distribution of radiation ranging from ultraviolet to near-infrared regions. The wavelength of the light emitted from the xenon flash lamp is shorter than that of the light emitted from the conventional halogen lamp, and it almost coincides with the fundamental absorption band of a silicon semiconductor wafer. Therefore, when a semiconductor wafer is irradiated with the flashes of light emitted from the xenon flash lamps, the temperature of the semiconductor wafer can be raised quickly with only a small amount of light transmitted through the semiconductor wafer. It has also turned out that the flashes of light emitted within an extremely short period of time such as several milliseconds or less allow a selective temperature rise only near the surface of a semiconductor wafer. For this reason, such a temperature rise caused by using the xenon flash lamps in an extremely short time allows only the activation of impurities to be implemented without deep diffusion of the impurities.

Now, as a typical measure of the properties of semiconductor wafers implanted with impurities, used is a sheet resistance value Rs. Since the activation of impurities decreases a sheet resistance value on the surface of a semiconductor wafer, a lower sheet resistance value generally indicates that better activation of impurities is achieved. For this reason, a further decrease in the sheet resistance value is desired. In order to decrease the sheet resistance value, the surface temperature of a semiconductor wafer has only to be further increased.

In order to further increase the attained surface temperature of a semiconductor wafer to be still higher with the emission of flashes of light from flash lamps, however, it is necessary to emit flashes of light with greater irradiation energy in an extremely short period of time, which must result in an increase in the loads of both flash lamps and driving circuits therefor. Consequently, there also arises a problem of shortening the lifetimes of such flash lamps.

Further, since the intensity distribution of flash light in the surface of a semiconductor wafer is not completely uniform and fine patterns are formed on the surface of the semiconductor wafer, the inplane distribution of light absorptivity is not also uniform. Consequently, there is also variation in the inplane temperature distribution of the semiconductor wafer when the semiconductor wafer is irradiated with flashes of light.

A tendency is found that the intensity becomes higher in the peripheral portion of a semiconductor wafer than that in the central portion thereof also due to the effect of reflection on a chamber wall surface or the like. Consequently, there is also variation in the inplane temperature distribution of the semiconductor wafer when the semiconductor wafer is irradiated with flashes of light, with a tendency that the temperature is more apt to increase in the peripheral portion than in the central portion. Moreover, it is very difficult to cancel the variation in the inplane temperature distribution in a heat treatment with irradiation using flash light in an extremely short irradiation time.

SUMMARY OF THE INVENTION

The present invention is intended for a heat treatment method for heating a substrate implanted with impurities by irradiating the substrate with flash light.

According to an aspect of the present invention, the heat treatment method comprises the steps of forming a carbon or carbon compound thin film on a surface of a substrate implanted with impurities, housing a substrate with a thin film formed thereon in a chamber, and irradiating the substrate housed in the chamber with flash light emitted from a flash lamp.

Since the carbon or carbon compound thin film is formed on the surface of the substrate implanted with impurities and the substrate is irradiated with flash light emitted from the flash lamp, the thin film absorbs the flash light to raise the temperature thereof and it is thereby possible to increase the surface temperature of the substrate to be still higher and decrease the sheet resistance value.

Preferably, the heat treatment method further comprises the step of introducing oxygen gas into the chamber after housing the substrate in the chamber and before emitting flash light.

Since oxygen gas is supplied into the chamber before emitting flash light, the thin film is oxidized during the irradiation with flash light to allow removal of the thin film to proceed and the nonuniformy in the temperature distribution due to the variation in the intensity of flash light can be cancelled.

According another aspect of the present invention, the heat treatment method comprises a thin film formation step of forming a thin film having a nonuniform film thickness distribution on a surface of a substrate implanted with impurities, and a light emission step of emitting flash light from a flash lamp to the substrate with the thin film formed thereon.

With the thin film having a nonuniform film thickness distribution, the variation in the intensity distribution of flash light can be cancelled and the surface temperature of the substrate can be raised uniformly.

Preferably, a thin film is formed on a surface of the substrate so that the film thickness thereof becomes smaller from the central portion of the substrate toward the peripheral portion thereof in the thin film formation step.

The variation in the intensity distribution of flash light in which the light intensity becomes higher in the peripheral portion than in the central portion can be cancelled, and the surface temperature of the substrate can be thereby raised uniformly.

The present invention is intended for a heat treatment apparatus for heating a substrate implanted with impurities by irradiating the substrate with flash light.

According to an aspect of the present invention, the heat treatment apparatus comprises a chamber for housing a substrate in which a carbon or carbon compound thin film is formed on a surface thereof after being implanted with impurities, a holding part for holding the substrate in the chamber, and a flash lamp for emitting flash light to the substrate held by the holding part.

Since the substrate with the carbon or carbon compound thin film formed thereon after impurities are implanted therein is irradiated with flash light emitted from the flash lamp, the thin film absorbs the flash light to raise the temperature thereof, and it is thereby possible to increase the surface temperature of the substrate to be still higher and decrease the sheet resistance value.

Preferably, the heat treatment apparatus further comprises an oxygen introduction part for introducing oxygen gas into the chamber.

Since oxygen gas is introduced into the chamber, the thin film is oxidized during the irradiation with flash light to allow removal of the thin film to proceed and the nonuniformy in the temperature distribution due to the variation in the intensity of flash light can be cancelled.

According to another aspect of the present invention, the heat treatment apparatus comprises a chamber for housing a substrate in which a carbon or carbon compound thin film is formed on a surface thereof after being implanted with impurities, a holding part for holding the substrate in the chamber, a preheating part for preheating the substrate held by the holding part, a flash lamp for emitting flash light to the substrate held by the holding part, an oxygen gas supply part for supplying oxygen gas from around the substrate held by the holding part in the chamber, an exhaust part for exhausting the atmosphere in the chamber from below the substrate held by the holding part, and a control part configured to control the preheating part to heat the substrate held by the holding part, control the oxygen gas supply part to supply oxygen gas while controlling the exhaust part to exhaust the atmosphere from the chamber, to thereby make the film thickness smaller from the central portion of the thin film formed on the surface of the substrate toward the peripheral portion thereof, and then control the flash lamp to emit flash light.

With the thin film of which the film thickness becomes smaller from its central portion toward its peripheral portion, the variation in the intensity distribution of flash light in which the light intensity becomes higher in the peripheral portion than in the central portion can be cancelled and the surface temperature of the substrate can be raised uniformly.

Therefore, it is an object of the present invention to increase the surface temperature of the substrate and decrease the sheet resistance value.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a longitudinal section showing a configuration of a heat treatment apparatus in accordance with a first preferred embodiment of the present invention.

FIG. 2 is a cross section showing a gas passage of the heat treatment apparatus of FIG. 1.

FIG. 3 is a cross section showing a structure of a holder.

FIG. 4 is a plan view showing a hot plate.

FIG. 7 is a flowchart showing part of an operation flow of processing a semiconductor wafer in accordance with the first preferred embodiment.

FIG. 11 is a view showing a correlation between charge voltage and a sheet resistance value.

FIG. 12 is a view schematically showing variation in the decrease of film thickness of the carbon thin film.

FIG. 13 is a longitudinal section showing a configuration of a heat treatment apparatus in accordance with a second preferred embodiment of the present invention.

FIG. 15 is a schematic plan view showing the chamber of the heat treatment apparatus taken along the horizontal plane at the level of a gas outlet.

FIG. 20 is a cross section of a semiconductor wafer immediately after a carbon thin film is formed on the surface of a silicon substrate.

FIG. 21 is a schematic view showing an airflow formed in the chamber of the heat treatment apparatus.

FIG. 22 is a cross section of the semiconductor wafer after the carbon thin film is processed.

FIG. 23 is a cross section of the semiconductor wafer in which a plural-layered thin film is formed on the surface of a silicon substrate.

DESCRIPTION OF THE PREFERRED EMBODIMENTS

Figure 5:
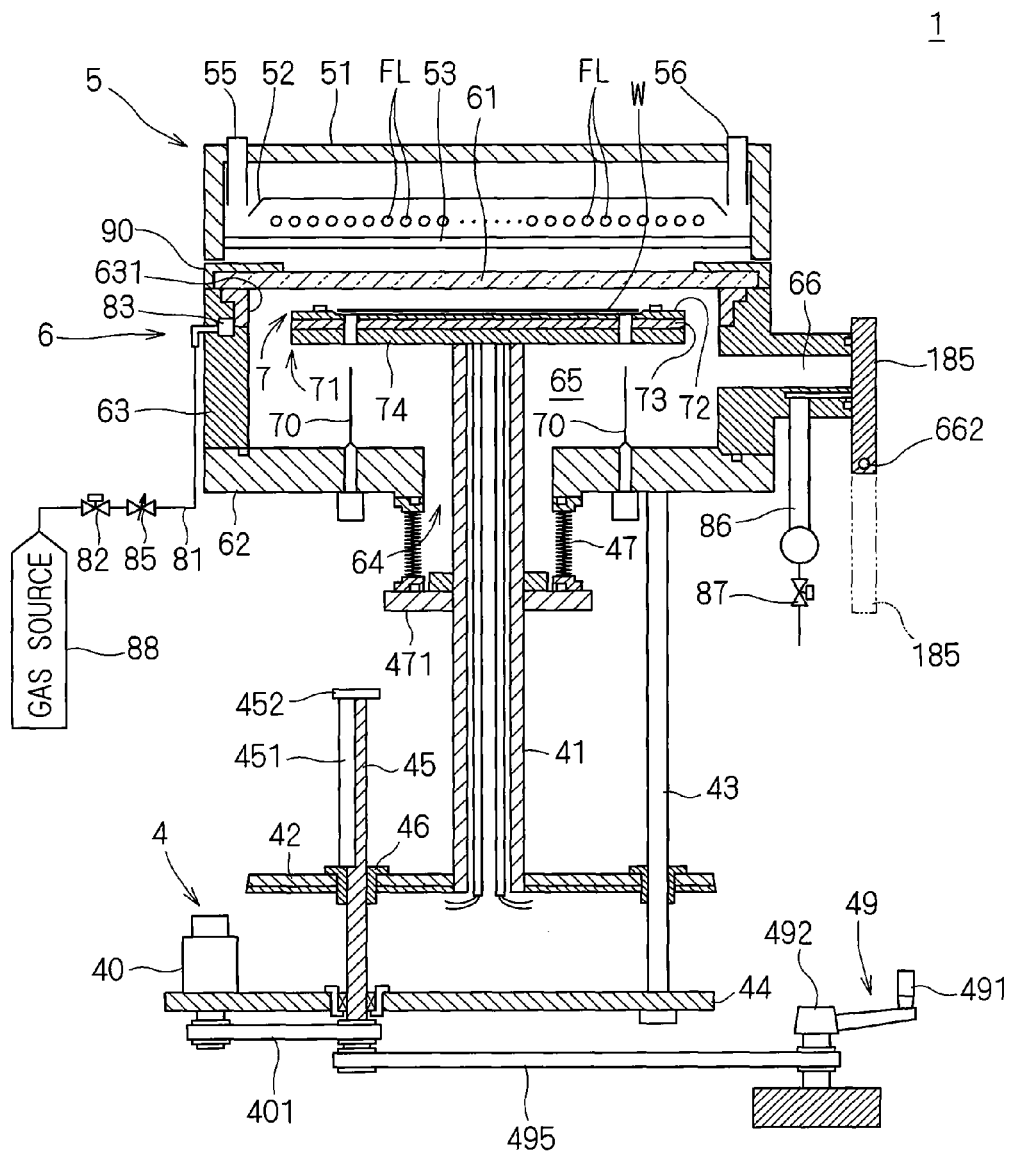
FIG. 5 is another longitudinal section showing the configuration of the heat treatment apparatus of FIG. 1.

Now, the preferred embodiments of the present invention will be discussed in detail with reference to the drawings.

The First Preferred Embodiment

First, a general configuration of a heat treatment apparatus in accordance with the present invention will be outlined. FIG. 1 is a longitudinal section showing a configuration of a heat treatment apparatus 1 in accordance with the first preferred embodiment of the present invention. The heat treatment apparatus 1 is a lamp annealer for irradiating a substantially circular semiconductor wafer W serving as a substrate with a flash of light so as to heat the semiconductor wafer W.

The heat treatment apparatus 1 comprises a substantially cylindrical chamber 6 for housing the semiconductor wafer W therein and a lamp house 5 incorporating a plurality of flash lamps FL. The heat treatment apparatus 1 further comprises a controller 3 for controlling operating mechanisms provided in the chamber 6 and in the lamp house 5 to perform a heat treatment on the semiconductor wafer W.

The chamber 6 is provided below the lamp house 5 and constituted of a chamber side portion 63 having a substantially cylindrical inner wall and a chamber bottom portion 62 covering the bottom of the chamber side portion 63. A space surrounded by the chamber side portion 63 and the chamber bottom portion 62 is defined as a heat treatment space 65. Above the heat treatment space 65 is a top opening 60 equipped with and blocked by a chamber window 61.

The chamber window 61 forming the ceiling of the chamber 6 is a disk-shaped member made of quartz and serves as a quartz window that transmits flash light emitted from the lamp house 5 into the heat treatment space 65. The chamber bottom portion 62 and the chamber side portion 63, which form the main body of the chamber 6, are made of, for example, a metal material such as stainless steel having high strength and high heat resistance, and a ring 631 provided on the upper inner side surface of the chamber side portion 63 is made of an aluminum (Al) alloy or the like having greater durability than stainless steel against degradation due to light irradiation.

In order to maintain the hermeticity of the heat treatment space 65, the chamber window 61 and the chamber side portion 63 are sealed with an O-ring. To be more specific, the O-ring is inserted between a lower-side peripheral portion of the chamber window 61 and the chamber side portion 63, and a clamp ring 90 is provided to abut against an upper-side peripheral portion of the chamber window 61 and to be screwed to the chamber side portion 63, whereby the chamber window 61 is forced onto the O-ring.

The chamber bottom portion 62 has a plurality of (three, in this preferred embodiment) support pins 70 extending upright therefrom through a holder 7 in order to support the semiconductor wafer W from the lower surface thereof (the surface opposite to a surface to be irradiated with light from the lamp house 5). The support pins 70 are made of, for example, quartz and can be replaced easily because the support pins 70 are secured from the outside of the chamber 6.

The chamber side portion 63 has a transport opening 66 for loading/unloading of the semiconductor wafer W therethrough. The transport opening 66 is openable and closable by a gate valve 185 that pivots about an axis 662. To the opposite side of the chamber side portion 63 from the transport opening 66, connected is a gas inlet passage 81 for introducing a process gas into the heat treatment space 65. The gas inlet passage 81 has one end connected to a gas inlet buffer 83 formed inside the chamber side portion 63 and the other end communicating with a gas source 88. At some midpoint in the gas inlet passage 81, interposed are a gas valve 82 and a flow rate regulating valve 85. The gas source 88 supplies an inert gas such as nitrogen ($N_2$) gas, helium (He) gas, or argon (Ar) gas or a reactive gas such as oxygen ($O_2$) gas or ammonia ($NH_3$) gas to the gas inlet passage 81. The gas source 88 selectively supplies any one of these gases or supplies a mixture of the gases as the process gas. Further, the transport opening 66 has an outlet passage 86 formed to exhaust gas from the heat treatment space 65 and connected through a gas valve 87 to a not-shown exhaust mechanism.

FIG. 2 is a cross section of the chamber 6 taken along the horizontal plane at the level of the gas inlet buffer 83. As shown in FIG. 2, the gas inlet buffer 83 is formed to extend over about one third of the inner periphery of the chamber side portion 63 on the opposite side from the transport opening 66 shown in FIG. 1. When the gas valve 82 is opened, the process gas is supplied from the gas source 88 to the gas inlet passage 81 and guided to the gas inlet buffer 83, and further supplied through a plurality of gas supply holes 84 into the heat treatment space 65. The flow rate of the process gas to be supplied is determined by the flow rate regulating valve 85. When the gas valve 87 is opened, the atmosphere inside the heat treatment space 65 is exhausted through the outlet passage 86. This causes an airflow of the process gas in the heat treatment space 65, which is indicated by the arrows AR4 of FIG. 2.

Referring back to FIG. 1, the heat treatment apparatus 1 further comprises the substantially disk-shaped holder 7 for holding the semiconductor wafer W being rested in a horizontal position inside the chamber 6 and preheating the semiconductor wafer W held thereby prior to irradiation with flash light and a holder elevating mechanism 4 for moving the holder 7 vertically relative to the chamber bottom portion 62 which is the bottom of the chamber 6. The holder elevating mechanism 4 of FIG. 1 includes a substantially cylindrical shaft 41, a movable plate 42, guide members 43 (in the present preferred embodiment, three guide members 43 are provided around the shaft 41), a fixed plate 44, a ball screw 45, a nut 46, and a motor 40. The chamber bottom portion 62, which is the bottom of the chamber 6, has a substantially circular bottom opening 64 having a diameter smaller than that of the holder 7. The shaft 41 of stainless steel extends through the bottom opening 64 and is connected to the underside of the holder 7 (strictly describing, a hot plate 71 of the holder 7) to support the holder 7.

The nut 46 in threaded engagement with the ball screw 45 is fixed to the movable plate 42. The movable plate 42 is movable in a vertical direction while being slidably guided by the guide members 43 that are fixed to and extend downwardly from the chamber bottom portion 62. The movable plate 42 is also coupled to the holder 7 through the shaft 41.

The motor 40 is installed on the fixed plate 44 mounted to the lower ends of the guide members 43 and is connected to the ball screw 45 via a timing belt 401. When the holder elevating mechanism 4 moves the holder 7 vertically, the motor 40 serving as a driving part rotates the ball screw 45 under the control of the controller 3 to cause the movable plate 42 fixed to the nut 46 to move along the guide members 43 in the vertical direction. Consequently, the shaft 41 fixed to the movable plate 42 is moved in the vertical direction, and the holder 7 connected to the shaft 41 is thereby moved up and down smoothly between a transfer position shown in FIG. 1 for transfer of the semiconductor wafer W and a processing position shown in FIG. 5 for processing of the semiconductor wafer W.

On the upper surface of the movable plate 42, a mechanical stopper 451 of substantially semi-cylindrical shape (the shape formed by cutting a cylinder into half along its length) extends upright along the ball screw 45. Even if any anomalies happen to cause the movable plate 42 to move up beyond a predetermined upper limit, the top end of the mechanical stopper 451 will strike an end plate 452 provided at an end portion of the ball screw 45, whereby the abnormal upward movement of the movable plate 42 is prevented. This prevents the holder 7 from moving up beyond a predetermined position lying under the chamber window 61, thus avoiding collision of the holder 7 with the chamber window 61.

The holder elevating mechanism 4 further includes a manual elevator 49 for manually moving the holder 7 up and down for the maintenance of the interior of the chamber 6. The manual elevator 49 includes a handle 491 and a rotary shaft 492 and can move the holder 7 up and down by rotating the rotary shaft 492 with the handle 491 to thereby rotate the ball screw 45 connected to the rotary shaft 492 via a timing belt 495.

On the underside of the chamber bottom portion 62, expandable and contractible bellows 47 that extend downwardly around the shaft 41 are provided, with their upper ends connected to the underside of the chamber bottom portion 62. The lower ends of the bellows 47 are mounted to a bellows-lower-end plate 471. The bellows-lower-end plate 471 is screwed to the shaft 41 with a collar member 411. The bellows 47 will contract when the holder elevating mechanism 4 moves the holder 7 upwardly relative to the chamber bottom portion 62, while the bellows 47 will expand when the holder elevating mechanism 4 moves the holder 7 downwardly. The expansion and contraction of the bellows 47 allows the heat treatment space 65 to be kept air-tight even during the upward and downward movement of the holder 7.

FIG. 3 is a cross section showing a structure of the holder 7. The holder 7 has a substantially disk-like shape with a diameter larger than that of the semiconductor wafer W. The holder 7 includes the hot plate (heating plate) 71 for performing preheating (what is called assisted heating) of the semiconductor wafer W and a susceptor 72 installed on the upper surface (the face where the holder 7 holds the semiconductor wafer W) of the hot plate 71. The underside of the holder 7 is, as described previously, connected to the shaft 41 for moving the holder 7 up and down. The susceptor 72 is made of quartz (or it may be of aluminum nitride (AlN) or the like) and has, on its upper surface, pins 75 for preventing misalignment of the semiconductor wafer W. The susceptor 72 is provided on the hot plate 71, with its underside in face-to-face contact with the upper surface of the hot plate 71. The susceptor 72 is thus capable of diffusing and transmitting heat energy from the hot plate 71 to the semiconductor wafer W placed on the upper surface of the susceptor 72 and is cleanable during the maintenance by being removed from the hot plate 71.

The hot plate 71 includes an upper plate 73 and a lower plate 74 both made of stainless steel. Resistance heating wires 76, such as nichrome wires, for heating the hot plate 71 are installed between the upper plate 73 and the lower plate 74, and a space between the upper plate 73 and the lower plate 74 is filled and sealed with electrically conductive brazing nickel (Ni). Respective end portions of the upper plate 73 and the lower plate 74 are brazed to each other.

FIG. 4 is a plan view showing the hot plate 71. As shown in FIG. 4, the hot plate 71 has a disk-like zone 711 and an annular zone 712 that are concentrically arranged in the central portion of an area facing the semiconductor wafer W being held, and four zones 713 to 716 formed by dividing a substantially annular area around the zone 712 into four equal sections in a circumferential direction. Each pair of adjacent zones has a slight gap formed therebetween. The hot plate 71 is further provided with three through holes 77 through which the support pins 70 are inserted, respectively. The three through holes 77 are circumferentially spaced apart from one another every 120 degrees in a gap between the zones 711 and 712.

In each of the six zones 711 to 716, the resistance heating wires 76 independent of one another are so provided as to circulate around the zone to form an individual heater. The heater incorporated in each zone individually heats the zone. The semiconductor wafer W held by the holder 7 is heated by those heaters incorporated in the six zones 711 to 716. Each of the zones 711 to 716 has a sensor 710 for measuring the temperature of the zone with a thermocouple. Each sensor 710 is connected to the controller 3 through the inside of the substantially cylindrical shaft 41.

For heating the hot plate 71, the controller 3 controls the amount of power to be supplied to the resistance heating wires 76 provided in each zone so that the temperature of each of the six zones 711 to 716 measured by the sensor 710 becomes a predetermined preset temperature. The controller 3 uses PID (Proportional Integral Derivative) control for the temperature control of each zone. In the hot plate 71, the temperature of each of the zones 711 to 716 is continuously measured until the heat treatment on the semiconductor wafer W is completed (or, when there are a plurality of semiconductor wafers W to be treated in succession, until the heat treatment on all the semiconductor wafers W is completed), and the amount of power to be supplied to the resistance heating wires 76 provided in each zone is controlled on an individual basis, i.e., the temperature of the heater incorporated in each zone is controlled individually, whereby the temperature of each zone is kept at a set temperature. The set temperature of each zone can be changed only by an individually determined offset value from a reference temperature.

The resistance heating wires 76 provided in each of the six zones 711 to 716 are connected to a plate power supply 98 (see FIG. 6) via a power line passing through the inside of the shaft 41. On the way from the plate power supply 98 to each zone, the power line from the plate power supply 98 is installed within a stainless tube filled with an insulator such as magnesia (magnesium oxide) so as to be electrically insulated from the other lines. The inside of the shaft 41 is open to the atmosphere.

The lamp house 5 is provided above the chamber 6. The lamp house 5 comprises, inside a case 51, a light source including a plurality of (in this preferred embodiment, thirty) xenon flash lamps FL, and a reflector 52 provided to cover over the light source. The lamp house 5 also has a lamp light radiating window 53 mounted to the bottom of the case 51.

The lamp light radiating window 53 forming the floor portion of the lamp house 5 is a plate-like member made of quartz. Since the lamp house 5 is provided above the chamber 6, the lamp light radiating window 53 is opposed to the chamber window 61. The lamp house 5 emits flash light from the flash lamps FL through the lamp light radiating window 53 and the chamber window 61 to the semiconductor wafer W held by the holder 7 in the chamber 6, to thereby heat the semiconductor wafer W.

The plurality of flash lamps FL, each of which is a rod-shaped lamp having a long-length cylindrical shape, are arranged in a plane with their longitudinal directions in parallel with one another along the main surface (i.e., along the horizontal direction) of the semiconductor wafer W held by the holder 7. The plane defined by the array of the flash lamps FL is accordingly a horizontal plane. The area of the plane defined by the array of the plurality of flash lamps FL is at least larger than the area of the semiconductor wafer W held by the holder 7.

The xenon flash lamp FL comprises a rod-like glass tube (discharge tube) which is filled with xenon gas and provided with an anode and a cathode connected to a capacitor at its respective end portions and a trigger electrode coiled around the outer peripheral surface of the glass tube. Since the xenon gas is an electrical insulator, no electricity flows in the glass tube in a normal state even if electric charges are accumulated in the capacitor. In a case where high voltage is applied to the trigger electrode to break the insulation, however, the electricity accumulated in the capacitor instantaneously flows into the glass tube and light is emitted by excitation of atoms or molecules of the xenon at that time. Such a xenon flash lamp FL, in which the electrostatic energy accumulated in the capacitor in advance is converted into an extremely short light pulse ranging from 0.1 to 100 milliseconds, has a characteristic feature of being capable of emitting extremely intense light as compared with a light source of successive lighting. The light emission time of the flash lamp FL can be controlled by the coil constant of a lamp power supply 99 (see FIG. 6) for supplying the flash lamps FL with power.

The reflector 52 is provided above the plurality of flash lamps FL to cover over all those flash lamps FL. The fundamental function of the reflector 52 is to reflect the flash light emitted from the plurality of flash lamps FL toward the holder 7. The reflector 52 is an aluminum alloy plate, and its surface (facing the flash lamps FL) is roughened by abrasive blasting to produce a satin finish thereon. Such surface roughing is required, because if the reflector 52 has a perfect mirror surface, the intensity of the reflected light from the plurality of flash lamps FL will exhibit a regular pattern, which can cause deterioration in the uniformity of the surface temperature distribution in the semiconductor wafer W.

Figure 6:
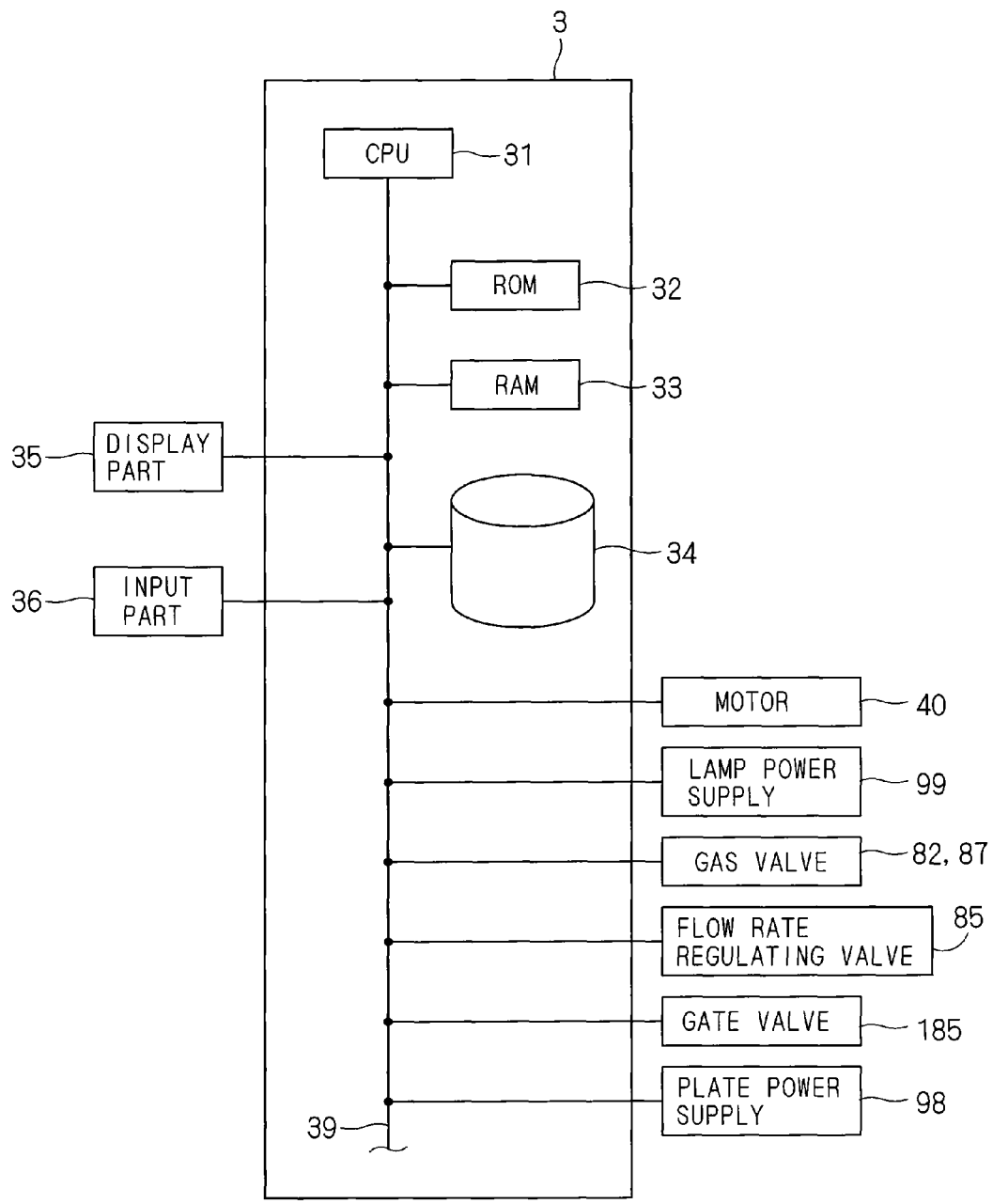
FIG. 6 is a block diagram showing a constitution of a controller in accordance with the first preferred embodiment.

The controller 3 controls the aforementioned various operating mechanisms provided in the heat treatment apparatus 1. FIG. 6 is a block diagram showing a constitution of the controller 3. The hardware configuration of the controller 3 is similar to that of a general computer. Specifically, the controller 3 has a constitution in which a CPU 31 for performing various computations, a ROM or read-only memory 32 for storing basic programs therein, a RAM or readable/writable memory 33 for storing various pieces of information therein, a magnetic disk 34 for storing control software, data or the like therein are connected to a bus line 39.

To the bus line 39, the motor 40 of the holder elevating mechanism 4 for moving the holder 7 up and down in the chamber 6, the lamp power supply 99 for supplying the flash lamps FL with power, the gas valves 82 and 87 for supplying and exhausting the process gas to/from the chamber 6, the flow rate regulating valve 85, the gate valve 185 for opening and closing the transport opening 66, the plate power supply 98 for supplying the zones 711 to 716 of the hot plate 71 with power, and the like are electrically connected. The CPU 31 of the controller 3 executes the control software stored in the magnetic disk 34 to control these operation mechanisms, to thereby allow the heat treatment on the semiconductor wafer W to proceed.

Further, to the bus line 39, a display part 35 and an input part 36 are also electrically connected. The display part 35 includes, e.g., a liquid crystal display (LCD) and the like and displays various pieces of information such as a processing result, details of a recipe and the like. The input part 36 includes, e.g., a keyboard, a mouse and the like and receives inputs such as commands, parameters and the like. An operator of this apparatus can input commands, parameters and the like by using the input part 36 while checking the contents displayed on the display part 35. Combining the display part 35 and the input part 36, a touch panel may be used.

The heat treatment apparatus 1 further comprises, in addition to the above constituent elements, various cooling mechanisms to prevent an excessive temperature rise in the chamber 6 and in the lamp house 5 due to heat energy generated by the flash lamps FL and the hot plate 71 during the heat treatment on the semiconductor wafer W. For example, a water cooled tube (not shown) is provided on the chamber side portion 63 and the chamber bottom portion 62 of the chamber 6. The lamp house 5 forms an air cooling structure in which a gas supply pipe 55 and an exhaust pipe 56 are provided to thereby form a gas flow therein and to exhaust heat (see FIGS. 1 and 5). Air is supplied also to a gap between the chamber window 61 and the lamp light radiating window 53, to thereby cool the lamp house 5 and the chamber window 61.

Now, a procedure for processing a semiconductor wafer W will be discussed. FIG. 7 is a flowchart showing part of an operation flow for processing the semiconductor wafer W in accordance with the first preferred embodiment. First, patterns are formed on a surface of the silicon substrate 11 (see FIG. 9) by using a photolithography technique and impurities (ions) such as boron (B) or arsenic (As) are implanted into a source/drain region (Step S1). The impurity implantation is performed by ion implantation.

Figure 9:
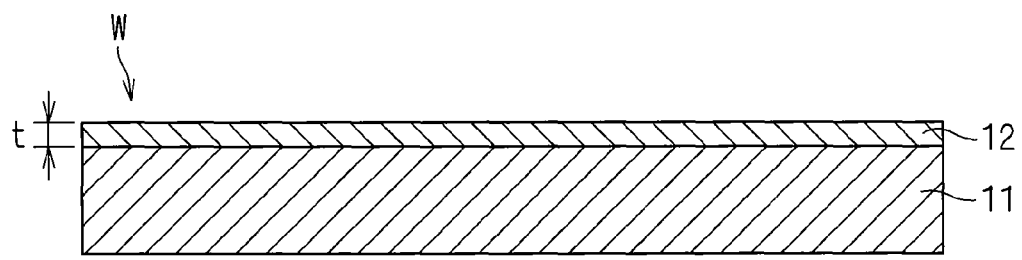
FIG. 9 is a cross section of a semiconductor wafer in which a carbon thin film is formed on the surface of a silicon substrate.

Subsequently, a carbon (C) thin film 12 is formed on the surface of the silicon substrate 11 implanted with the impurities (Step S2). For formation of the carbon thin film 12, various well-known techniques may be adopted. For example, the carbon thin film 12 may be formed by plasma deposition. FIG. 9 is a cross section of a semiconductor wafer W in which the carbon thin film 12 is formed on the surface of the silicon substrate 11. In the first preferred embodiment, on the surface of the silicon substrate 11 implanted with the impurities by ion implantation, the amorphous carbon thin film 12 is formed by plasma deposition. Further, in the first preferred embodiment, the film thickness t (the initial value of the film thickness) of the amorphous carbon thin film 12 formed on the surface of the silicon substrate 11 is 70 nm.

Next, the heat treatment apparatus 1 performs light irradiation heat treatment on the semiconductor wafer W in which the carbon thin film 12 is formed (Step S3). The light irradiation heat treatment performed on the semiconductor wafer W by the heat treatment apparatus 1 will be discussed later in more detail.

After the light irradiation heat treatment is finished by the heat treatment apparatus 1, cleaning of the semiconductor wafer W is performed (Step S4). This cleaning process includes so-called SPM cleaning (using a mixture of sulfuric acid and oxygenated water) and APM cleaning (using a mixture of aqueous ammonia and oxygenated water). By performing this cleaning process, the carbon thin film 12 is completely removed from the surface of the silicon substrate 11. In this specification, the "semiconductor wafer W" refers both to the silicon substrate 11 with no thin film formed on its surface and the silicon substrate 11 with a thin film 12 formed on its surface.

Figure 8:
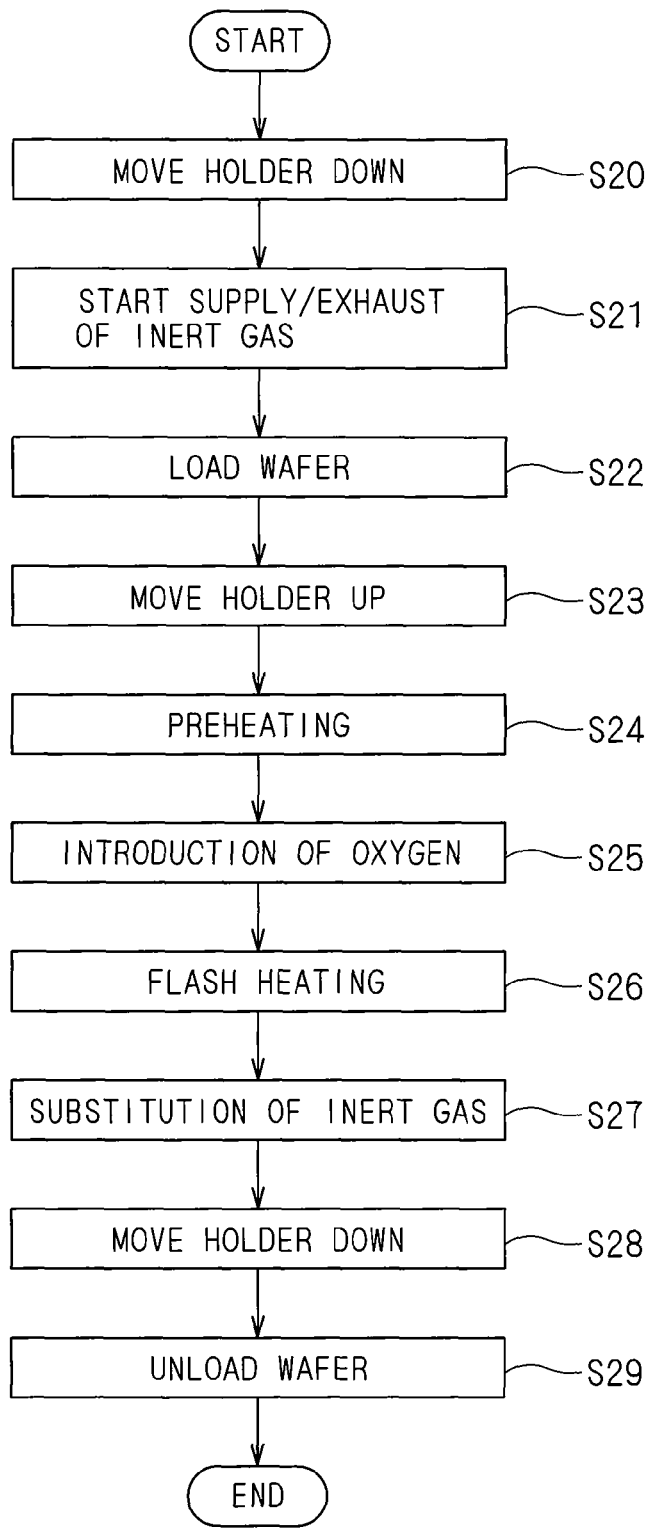
FIG. 8 is a flowchart showing process steps for processing the semiconductor wafer in the heat treatment apparatus in accordance with the first preferred embodiment.

FIG. 8 is a flowchart showing a procedure for processing the semiconductor wafer W in the heat treatment apparatus 1 in accordance with the first preferred embodiment. The procedure of FIG. 8 for processing the semiconductor wafer W is carried out by the controller 3 controlling the operation mechanisms of the heat treatment apparatus 1.

First, the holder 7 moves down from the processing position shown in FIG. 5 to the transfer position shown in FIG. 1 (Step S20). The "processing position" is a position where the holder 7 is located when the semiconductor wafer W is irradiated with light from the flash lamps FL, which is the position of the holder 7 in the chamber 6 shown in FIG. 5. The "transfer position" is a position where the holder 7 is located when the semiconductor wafer W is loaded or unloaded into/from the chamber 6, which is the position of the holder 7 in the chamber 6 shown in FIG. 1. The reference position of the holder 7 in the heat treatment apparatus 1 is the processing position. Before the processing, the holder 7 is located at the processing position, and when the processing starts, the holder 7 moves down to the transfer position.

The holder 7 moves up and down relative to the support pins 70 fixed to the chamber 6. As shown in FIG. 1, moving down to the transfer position, the holder 7 comes close to the chamber bottom portion 62 and the respective tips of the support pins 70 penetrate the holder 7 and protrude over the holder 7.

Next, after the holder 7 moves down to the transfer position, the gas valve 82 is opened and an inert gas (nitrogen gas in this preferred embodiment) is thereby supplied into the heat treatment space 65 of the chamber 6 from the gas source 88. At the same time, the gas valve 87 is opened and the gas is thereby exhausted from the heat treatment space 65 (Step S21). The nitrogen gas supplied into the chamber 6 flows in the heat treatment space 65 in the direction indicated by the arrows AR4 of FIG. 2 from the gas inlet buffer 83 and is exhausted through the outlet passage 86 and the gas valve 87 by utility exhaust. Part of the nitrogen gas supplied into the chamber 6 is exhausted also from an exhaust port (not shown) provided inside the bellows 47.

Subsequently, the gate valve 185 is opened to open the transport opening 66, and the semiconductor wafer W with the carbon thin film 12 formed on its surface is loaded into the chamber 6 through the transport opening 66 by a transfer robot provided outside this apparatus and placed on the plurality of support pins 70 (Step S22). After the semiconductor wafer W is loaded into the chamber 6, the transport opening 66 is closed by the gate valve 185. Then, the holder elevating mechanism 4 moves the holder 7 from the transfer position up to the processing position near the chamber window 61 (Step S23). In the course of moving the holder 7 up from the transfer position, the semiconductor wafer W is passed from the support pins 70 to the susceptor 72 of the holder 7 and placed on the upper surface of the susceptor 72 to be held thereon. When the holder 7 moves up to the processing position, the semiconductor wafer W held by the susceptor 72 is also held at the processing position.

Each of the six zones 711 to 716 of the hot plate 71 is already heated up to a predetermined temperature by the heater (the resistance heating wires 76) which is individually incorporated within the zone (between the upper plate 73 and the lower plate 74). The holder 7 is moved up to the processing position and the semiconductor wafer W comes into contact with the holder 7, whereby the semiconductor wafer W is preheated by the heaters incorporated in the hot plate 71 and the temperature thereof increases gradually (Step S24).

The preheating of the semiconductor wafer W at the processing position for about 60 seconds increases the temperature of the semiconductor wafer W up to a preheating temperature T1 which is set in advance. The preheating temperature T1 is set ranging from about 200° C. to about 600° C., preferably from about 350° C. to about 550° C., at which there is no apprehension that the impurities implanted in the semiconductor wafer W might be diffused by heat. The distance between the holder 7 and the chamber window 61 is arbitrarily adjustable by controlling the amount of rotation of the motor 40 of the holder elevating mechanism 4.

Concurrently with the preheating of the semiconductor wafer W performed at the processing position, oxygen gas is introduced into the heat treatment space 65 of the chamber 6 (Step S25). Specifically, the oxygen gas is supplied into the heat treatment space 65 from the gas source 88 through the gas inlet passage 81. At that time, only the oxygen gas may be supplied or a mixed gas of nitrogen gas and oxygen gas may be supplied. The flow rate of the oxygen gas to be supplied into the heat treatment space 65 from the gas source 88 is controlled by the controller 3 controlling the gas valve 82 and the flow rate regulating valve 85. In the first preferred embodiment, by the supply of the oxygen gas in Step S25, the concentration of oxygen in the heat treatment space 65 is set to be 90% or more.

After the preheating time for about 60 seconds has elapsed and the oxygen concentration in the chamber 6 becomes 90% or more, the flash light is emitted from the flash lamps FL of the lamp house 5 toward the semiconductor wafer W under the control of the controller 3 in the state where the holder 7 is located at the processing position (Step S26). At that time, part of the flash light emitted from the flash lamps FL travels directly to the holder 7 inside the chamber 6. The remainder of the flash light is reflected by the reflector 52, and the reflected light travels to the inside of the chamber 6. With such emission of the flash light, the flash heating is performed on the semiconductor wafer W. The flash heating, which is achieved by emission of the flash light from the flash lamps FL, can raise the surface temperature of the semiconductor wafer W in a short time.

Specifically, the flash light emitted from the flash lamps FL of the lamp house 5 is an extremely short and intense flash of light emitted for a period of time not shorter than 0.1 milliseconds and not longer than 100 milliseconds because the previously stored electrostatic energy is converted into such an ultrashort light pulse. The surface temperature of the semiconductor wafer W (exactly, the surface temperature of the carbon thin film 12) subjected to the flash heating by emission of flash light from the flash lamps FL instantaneously rises to a treatment temperature T2, and after the impurities implanted in the semiconductor wafer W are activated, the surface temperature falls quickly. In the heat treatment apparatus 1, since the surface temperature of the semiconductor wafer W can be increased and decreased in an extremely short time, activation of the impurities implanted in the semiconductor wafer W can be achieved while the diffusion of the impurities due to heat is suppressed. Since the time period required for the activation of the impurities is extremely short as compared with the time period required for the thermal diffusion of the impurities, the activation is completed even in a short time ranging from about 0.1 to about 100 milliseconds during which no diffusion occurs.

Figure 10:
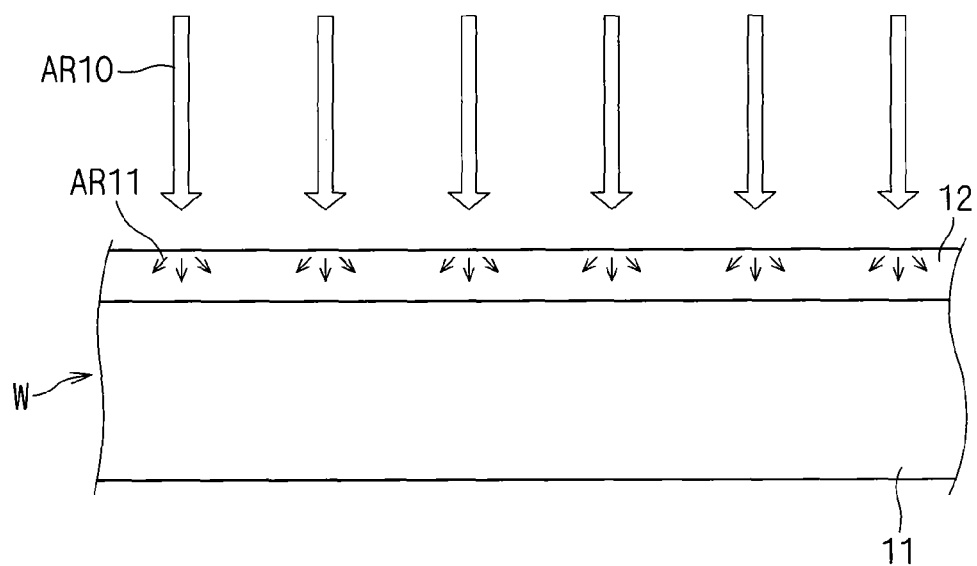
FIG. 10 is a schematic view showing a state where the semiconductor wafer in which the carbon thin film is formed is irradiated with flash light.

FIG. 10 is a schematic view showing a state where the semiconductor wafer W with the carbon thin films 12 formed thereon is irradiated with flash light. As the film thickness of the carbon thin film 12 formed on the surface of the semiconductor wafer W becomes larger, the surface reflectance of the semiconductor wafer W decreases, and in the first preferred embodiment, when the film thickness is 70 nm, the surface reflectance is about 60%. The decrease in the surface reflectance means the increase in the absorptivity of flash light in the semiconductor wafer W, and more specifically, it means the increase in the absorptivity of flash light in the carbon thin film 12. The spectral distribution of radiation of flash light from the xenon flash lamps FL ranges from ultraviolet to near-infrared regions and the flash light hardly passes through the silicon substrate 11.

The decrease in the surface reflectance of the semiconductor wafer W with the increase in the film thickness of the carbon thin film 12 is caused by the increase in the absorptivity of flash light in the carbon thin film 12 with the increase in the film thickness thereof. Specifically, when the carbon thin film 12 becomes thick to some degree or more, part of the flash light emitted as indicated by the arrow AR10 of FIG. 10 is absorbed by the thin film 12. The absorptivity becomes larger as the film thickness of the thin film 12 becomes larger. Heat is generated on the surface of the carbon thin film 12 which has absorbed the flash light and the heat is transferred to the surface of the silicon substrate 11 as indicated by the arrow AR11.

Thus, the carbon thin film 12 having a given film thickness or more functions as a light absorption film to increase the absorptivity of flash light in the semiconductor wafer W. As a result of increasing the absorptivity of flash light in the semiconductor wafer W, the attained surface temperature of the semiconductor wafer W during irradiation with the flash light (strictly describing, the attained surface temperature of the surface of the silicon substrate 11 implanted with the impurities) increases as compared with that in the case where no thin film 12 is formed, and this allows better activation of the impurities to be achieved.

FIG. 11 is a view showing a correlation between charge voltage and the sheet resistance value. The charge voltage indicated by the horizontal axis is voltage to be applied to the capacitor of the lamp power supply 99 (see FIG. 6) which supplies power to the flash lamps FL, serving as an index indicating the magnitude of the energy of flash light emitted from the flash lamps FL. The sheet resistance value Rs indicated by the vertical axis serves as an index indicating the degree of activation of the impurities, and a lower sheet resistance value indicates higher temperature of the heated surface of the semiconductor wafer W and execution of better activation of the impurities. In FIG. 11, the solid line indicates the correlation in the semiconductor wafer W of the first preferred embodiment with the carbon thin film 12 formed thereon and the dotted line indicates the correlation in the semiconductor wafer W with no carbon thin film 12 formed thereon.

As shown in FIG. 11, if the same charge voltage is applied, the sheet resistance value becomes lower and in other words, the surface temperature of the semiconductor wafer W becomes higher when the carbon thin film 12 is formed. The difference in the sheet resistance value is more particularly remarkable when the charge voltage is lower, and the semiconductor wafer W with the carbon thin film 12 formed thereon as shown in the first preferred embodiment can achieve a sufficiently low sheet resistance value even if a low charge voltage is applied. In other words, when the carbon thin film 12 is formed on the semiconductor wafer W, the surface temperature can be increased to be still higher and the sheet resistance value can be decreased even if the energy of the flash light from the flash lamps FL is relatively small.

As shown in FIG. 10, the flash light emitted from the flash lamps FL is once absorbed by the carbon thin film 12 which is uniformly formed to cause heat in the thin film 12, and then the heat is transferred to the surface of the silicon substrate 11 as indicated by the AR11. Therefore, even if there is variation of the absorptivity in the surface of the silicon substrate 11 due to formation of patterns, the variation of the absorptivity can be eased as compared with the case where no thin film is formed, and the surface of the silicon substrate 11 implanted with the impurities is thereby uniformly heated.

In the first preferred embodiment, the oxygen concentration in the chamber 6 is set to 90% or more when flash light is emitted from the flash lamps FL. The carbon of the thin film 12 heated by irradiation with flash light reacts with oxygen to produce carbon dioxide ($CO_2$) or carbon monoxide (CO). The carbon of the thin film 12 is thus vaporized, being consumed, and the film thickness of the thin film 12 decreases. In other words, the carbon thin film 12 is removed by introduction of oxygen into the chamber 6 while serving as a light absorption film during the irradiation with flash light. Since the produced oxide of carbon is gas, the gas is exhausted together with the atmospheric gas in the chamber 6 through the outlet passage 86 and the gas valve 87 to the outside of the heat treatment apparatus 1.

The rate of decrease in the film thickness of the thin film 12 due to consumption of carbon during the irradiation with flash light is not uniform in the plane of the semiconductor wafer W. In other words, the intensity of the flash light emitted from the flash lamps FL through the lamp light radiation window 53 and the chamber window 61 to the heat treatment space 65 is not necessarily uniform and this causes variation of the intensity distribution in the plane of the semiconductor wafer W. For this reason, as a result of causing variation in the inplane temperature distribution of the thin film 12, the rate of decrease in the film thickness becomes nonuniform.

FIG. 12 is a view schematically showing variation in the decrease of film thickness of the carbon thin film 12. It is assumed that the flash light emitted from the flash lamps FL through the lamp light radiation window 53 and the chamber window 61 into the heat treatment space 65 includes such less intense flash light as indicated by the arrow AR12 and such more intense flash light as indicated by the arrow AR13. In this case, in the surface of the carbon thin film 12, an area irradiated with the more intense flash light is heated to have higher temperature than another area irradiated with the less intense flash light. Consequently, the reaction of the ambient atmosphere with oxygen becomes more active and the rate of decrease in the film thickness becomes larger in the area irradiated with the more intense flash light than the area irradiated with the less intense flash light, and the film thickness of the carbon thin film 12 thus becomes uniform as shown in FIG. 12.

The absorptivity of flash light in the carbon thin film 12 depends on the film thickness, and specifically, the absorptivity increases as the film thickness becomes larger. Therefore, as the result that the film thickness of the thin film 12 thus becomes nonuniform, the remaining film thickness becomes larger and the absorptivity of flash light increases in the area irradiated with the less intense flash light than the area irradiated with the more intense flash light. In an area irradiated with flash light of higher intensity, the film thickness of the thin film 12 becomes smaller and the absorptivity of flash light decreases, and consequently, the surface temperature of the area decreases and the inplane temperature distribution becomes uniform in the thin film 12 on the whole. In other words, the nonuniformity in the film thickness of the thin film 12 caused by the difference in the intensity of flash light functions to cancel the variation in the inplane temperature distribution. If the inplane temperature distribution becomes uniform in the thin film 12 on the whole, the surface of the silicon substrate 11 implanted with the impurities can be also heated uniformly.

After the lapse of predetermined time (several seconds) from the end of the flash heating, nitrogen gas is supplied again into the heat treatment space 65 from the gas source 88 while the gas containing the oxygen gas is exhausted from the heat treatment space 65 through the outlet passage 86. The atmosphere in the chamber 6 is thereby substituted with the nitrogen gas (Step S27).

Then, the holder 7 is moved down again to the transfer position shown in FIG. 1 by the holder elevating mechanism 4, and the semiconductor wafer W is passed from the holder 7 to the support pins 70 (Step S28). Subsequently, the gate valve 185 opens the transport opening 66 having been closed, and the transfer robot provided outside this apparatus unloads the semiconductor wafer W rested on the support pins 70. Thus, the flash heat treatment (annealing process) on the semiconductor wafer W in the heat treatment apparatus 1 is completed (Step S29).

As discussed above, in the first preferred embodiment, formation of the carbon thin film 12 on the surface of the semiconductor wafer W allows the carbon thin film 12 to absorb the flash light. Absorbing the flash light causes the temperature of the carbon thin film 12 to rise, and it is thereby possible to increase the surface temperature of the silicon substrate 11 implanted with the impurities to be still higher and decrease the sheet resistance value as compared with the case where no thin film 12 is formed.

Particularly, if the carbon thin film 12 is formed on the surface of the semiconductor wafer W, a sufficiently low sheet resistance value can be achieved even with a low charge voltage as shown in FIG. 11. Therefore, without increasing the loads of the flash lamps FL and the lamp power supply 99, a low sheet resistance value can be achieved.

Since the oxygen concentration in the chamber 6 is set to 90% or more and the semiconductor wafer W with carbon thin film 12 formed thereon is irradiated with the flash light, the carbon of the heated thin film 12 is oxidized and thus vaporized, thereby being consumed. This allows removal of the carbon thin film 12 to proceed during the flash heating, and the remaining film of carbon can be removed only by the normal SPM cleaning and APM cleaning in the subsequent cleaning process (Step S4). If the flash light is emitted without introduction of the oxygen gas into the chamber 6, since the carbon of the thin film 12 is not consumed, the original film thickness is generally maintained even after the flash heating. In this case, the thin film 12 is not fully removed only by the normal SPM cleaning and APM cleaning and an ashing process is additionally needed before the cleaning process of Step S4. As shown in the first preferred embodiment, if oxygen gas is introduced into the chamber 6 to set the oxygen concentration therein to 90% or more during emission of flash light, the removal of the thin film 12 can be also achieved by the irradiation with flash light at the same time, and therefore, no ashing process is needed and the remaining film can be reliably removed only by the normal cleaning process. The carbon thin film 12 is not entirely vaporized during the emission of flash light, and the remaining film also serves as an antioxidizing film for the surface of the silicon substrate 11.

Further, in the first preferred embodiment, if there is variation in the intensity of the flash light emitted from the flash lamps FL, this causes variation in the rate of decrease in the film thickness of the thin film 12, which makes the film thickness thereof nonuniform, but the nonuniformity in the film thickness functions to cancel the variation in the inplane temperature distribution of the semiconductor wafer W. Specifically, in an area irradiated with flash light of higher intensity, the film thickness of the thin film 12 becomes smaller and the absorptivity of flash light decreases, and consequently, the surface temperature of the area decreases and the inplane temperature distribution becomes uniform in the surface of the semiconductor wafer W on the whole.

When the flash heat treatment is performed on the semiconductor wafer W with the carbon thin film 12 formed thereon, there may be deposition of carbon-based contaminants on the inside of the chamber 6. If there is deposition of such contaminants, oxygen gas is introduced into the chamber 6 to set the oxygen concentration therein to 90% or more, without housing the semiconductor wafer W in the chamber 6, and then the flash lamps FL emit flash light. In other words, idle flashing is performed while the oxygen concentration in the chamber 6 is kept at 90% or more. Like the flash heat treatment on the semiconductor wafer W, such idle flashing is also implemented by the controller 3 controlling the operation mechanisms (the gas valves 82 and 87, the flow rate regulating valve 85, the lamp power supply 99, and the like) of the heat treatment apparatus 1. By emitting the flash light from the flash lamps FL with the oxygen concentration in the chamber 6 kept at 90% or more, without housing the semiconductor wafer W in the chamber 6, the carbon-based contaminants are oxidized and thus removed.

In other words, by performing the idle flashing with the oxygen concentration in the chamber 6 kept at 90% or more, cleaning of the inside of the chamber 6 is achieved.

The Second Preferred Embodiment

Now, the second preferred embodiment of the present invention will be discussed. FIG. 13 is a longitudinal section showing a configuration of a heat treatment apparatus 1 in accordance with the second preferred embodiment of the present invention. The heat treatment apparatus 1 is a lamp annealer for irradiating a substantially circular semiconductor wafer W serving as a substrate with a flash of light so as to heat the semiconductor wafer W. The constituent elements identical to those in the first preferred embodiment are represented by the same reference signs.

The heat treatment apparatus 1 comprises a substantially cylindrical chamber 6 for housing the semiconductor wafer W therein and a lamp house 5 incorporating a plurality of flash lamps FL. The heat treatment apparatus 1 further comprises a controller 3 for controlling operating mechanisms provided in the chamber 6 and in the lamp house 5 to perform a heat treatment on the semiconductor wafer W.

The chamber 6 is provided below the lamp house 5 and constituted of a chamber side portion 63 having a substantially cylindrical inner wall and a chamber bottom portion 62 covering the bottom of the chamber side portion 63. A space surrounded by the chamber side portion 63 and the chamber bottom portion 62 is defined as a heat treatment space 65. Above the heat treatment space 65 is a top opening 60 equipped with and blocked by a chamber window 61.

The chamber window 61 forming the ceiling of the chamber 6 is a disk-shaped member made of quartz and serves as a quartz window that transmits flash light emitted from the lamp house 5 into the heat treatment space 65. The chamber bottom portion 62 and the chamber side portion 63, which form the main body of the chamber 6, are made of, for example, a metal material such as stainless steel having high strength and high heat resistance, and a ring 631 provided on the upper inner side surface of the chamber side portion 63 is made of an aluminum (Al) alloy or the like having greater durability than stainless steel against degradation due to light irradiation.

In order to maintain the hermeticity of the heat treatment space 65, the chamber window 61 and the chamber side portion 63 are sealed with an O-ring. To be more specific, the O-ring is inserted between a lower-side peripheral portion of the chamber window 61 and the chamber side portion 63, and a clamp ring 90 is provided to abut against an upper-side peripheral portion of the chamber window 61 and to be screwed to the chamber side portion 63, whereby the chamber window 61 is forced onto the O-ring.

The chamber bottom portion 62 has a plurality of (three, in this preferred embodiment) support pins 70 extending upright therefrom through a holder 7 in order to support the semiconductor wafer W from the lower surface thereof (the surface opposite to a surface to be irradiated with light from the lamp house 5). The support pins 70 are made of, for example, quartz and can be replaced easily because the support pins 70 are secured from the outside of the chamber 6.

The chamber side portion 63 has a transport opening 66 for loading/unloading of the semiconductor wafer W therethrough. The transport opening 66 is openable and closable by a gate valve 185 that pivots about an axis 662. When the gate valve 185 closes the transport opening 66, the heat treatment space 65 becomes a sealed space. When the gate valve 185 opens the transport opening 66, the loading/unloading of the semiconductor wafer W to/from the heat treatment space 65 becomes possible.

To the chamber side portion 63, connected is a gas inlet passage 81 for introducing a process gas into the heat treatment space 65. The gas inlet passage 81 has a tip end connected to a gas inlet buffer 83 formed inside the chamber side portion 63 and a base end communicating with a gas source 88. At some midpoint in the gas inlet passage 81, interposed are a gas valve 82 and a flow rate regulating valve 85. The gas source 88 supplies an inert gas such as nitrogen ($N_2$) gas, helium (He) gas, or argon (Ar) gas or a reactive gas such as oxygen ($O_2$) gas, ammonia ($NH_3$) gas, or ozone ($O_3$) gas to the gas inlet passage 81. The gas source 88 selectively supplies any one of these gases or supplies a mixture of the gases as the process gas.

Figure 14:
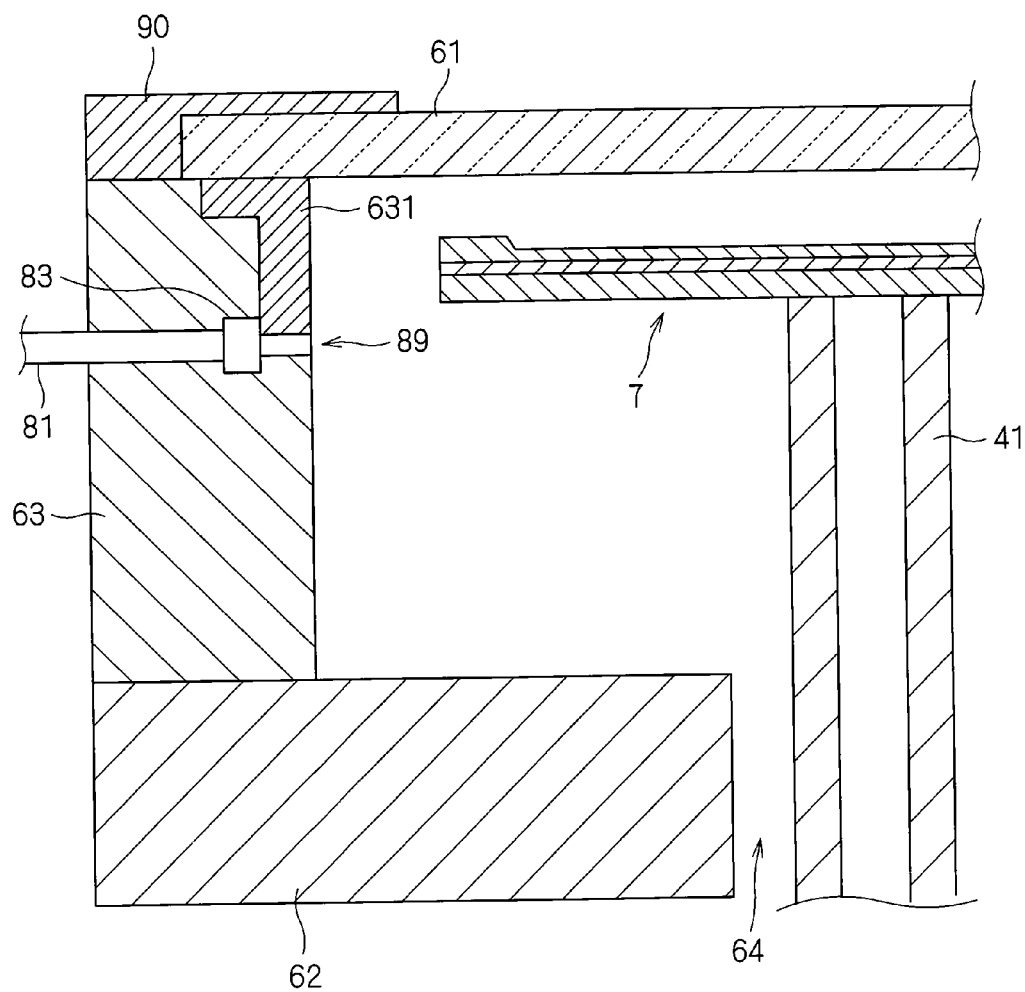
FIG. 14 is a partially enlarged cross section showing a mechanism for supplying gas to a chamber in the heat treatment apparatus of FIG. 13.

FIG. 14 is a partially enlarged cross section showing a mechanism for supplying gas to the chamber 6. In FIG. 14, the support pins 70 are not shown. As described above, the ring 631 made of an aluminum alloy having excellent resistance to flash is engaged in the upper inner side surface of the chamber side portion 63 made of stainless steel. By engaging the ring 631 in the chamber side portion 63, as shown in FIG. 14, a gas outlet 89 is formed between the lower end of the ring 631 and the chamber side portion 63. FIG. 15 is a schematic plan view showing the chamber 6 taken along the horizontal plane at the level of the gas outlet 89. The gas outlet 89 formed between the ring 631 and the chamber side portion 63 is a slit formed in a ring shape along the horizontal direction. The ring-shaped slit-like gas outlet 89 communicates with the gas inlet buffer 83 formed inside the chamber side portion 63. The gas inlet buffer 83 communicates with three ends of the gas inlet passage 81. Specifically, the tip portion of the gas inlet passage 81 branches into three, which are connected to the gas inlet buffer 83. The three-branched tip portions of the gas inlet passage 81 are connected to the gas inlet buffer 83 at equal intervals (e.g., at intervals of 120 degrees) along the circumferential direction of the cylinder of the chamber side portion 63.

By opening the gas valve 82, a process gas is supplied from the gas source 88 to the gas inlet passage 81, being guided to the gas inlet buffer 83 from the three directions. The flow rate of the process gas to be supplied is determined by the flow rate regulating valve 85. The process gas having flowed into the gas inlet buffer 83 flows, spreading in the gas inlet buffer 83 having passage resistance lower than that of the gas outlet 89, while being uniformly discharged through the gas outlet 89 out into the heat treatment space 65.

Referring back to FIG. 13, the heat treatment apparatus 1 further comprises the substantially disk-shaped holder 7 for holding the semiconductor wafer W being rested in a horizontal position inside the chamber 6 and preheating the semiconductor wafer W held thereby prior to irradiation with flash light and a holder elevating mechanism 4 for moving the holder 7 vertically relative to the chamber bottom portion 62 which is the bottom of the chamber 6. The constitution and operation of the holder elevating mechanism 4 shown in FIG. 13 are the same as those in the first preferred embodiment, and detailed description thereof will be omitted.

On the underside of the chamber bottom portion 62, expandable and contractible bellows 47 that extend downwardly around the shaft 41 are provided, with their upper ends connected to the underside of the chamber bottom portion 62. The lower ends of the bellows 47 are mounted to a bellows-lower-end plate 471. The bellows-lower-end plate 471 is screwed to the shaft 41 with a collar member (not shown). The bellows 47 will contract when the holder elevating mechanism 4 moves the holder 7 upwardly relative to the chamber bottom portion 62, while the bellows 47 will expand when the holder elevating mechanism 4 moves the holder 7 downwardly. The expansion and contraction of the bellows 47 allows the heat treatment space 65 to be kept air-tight even during the upward and downward movement of the holder 7.

The bellows-lower-end plate 471 is provided with a gas exhaust outlet 472 for exhausting gas from the heat treatment space 65. The gas exhaust outlet 472 is provided immediately below a bottom opening 64, in other words, near the center of the bottom of the chamber 6. The gas exhaust outlet 472 communicates with a gas exhaust pump 474 through a gas valve 473 and a flow rate regulating valve 475. When the gas valve 473 is opened while the gas exhaust pump 474 is operated, the gas in the chamber 6 is exhausted to the outside of the chamber 6 through the bottom opening 64 and the gas exhaust outlet 472. The transport opening 66 is provided with an outlet passage 86 for exhausting the gas from the heat treatment space 65, which communicates with a not-shown exhaust mechanism via the gas valve 87. The exhaust mechanism may be the gas exhaust pump 474.

When the process gas is discharged from the gas outlet 89 into the heat treatment space 65 inside the chamber 6 while the atmosphere is exhausted from the chamber 6 through the gas exhaust outlet 472, a flow of the process gas discharged from the inside of the chamber side portion 63 toward the central portion of the chamber bottom portion 62 is caused in the heat treatment space 65.

The constitution of the holder 7 is the same as that in the first preferred embodiment (see FIGS. 3 and 4). The constitution of the lamp house 5 and the configuration of the incorporated xenon flash lamps FL are absolutely the same as those in the first preferred embodiment.

Figure 17:
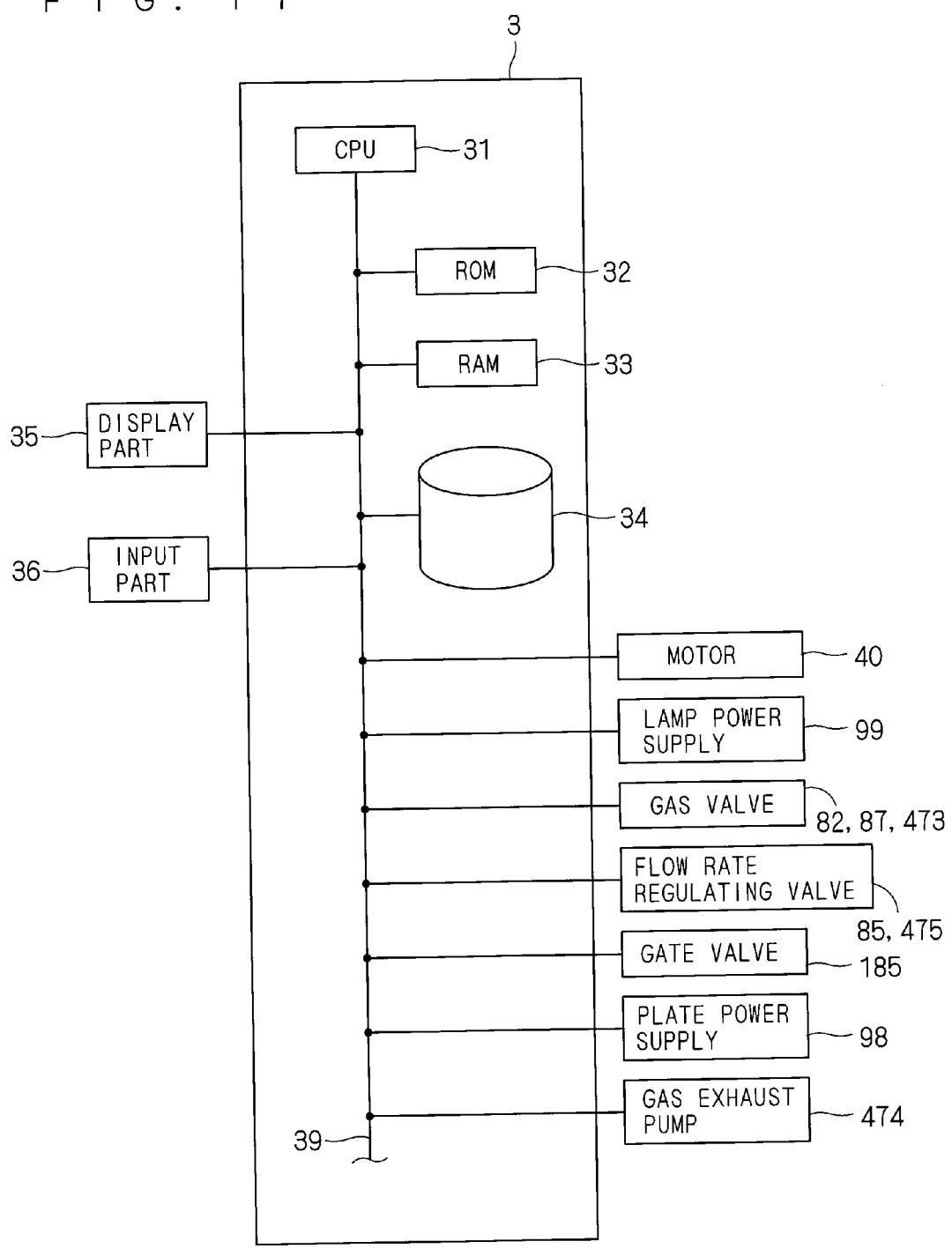
FIG. 17 is a block diagram showing a constitution of a controller in accordance with the second preferred embodiment.

The controller 3 controls the aforementioned various operating mechanisms provided in the heat treatment apparatus 1. FIG. 17 is a block diagram showing a constitution of the controller 3. The hardware configuration of the controller 3 is similar to that of a general computer. Specifically, the controller 3 has a constitution in which a CPU 31 for performing various computations, a ROM or read-only memory 32 for storing basic programs therein, a RAM or readable/writable memory 33 for storing various pieces of information therein, a magnetic disk 34 for storing control software, data or the like therein are connected to a bus line 39.

To the bus line 39, a motor 40 of the holder elevating mechanism 4 for moving the holder 7 up and down in the chamber 6, a lamp power supply 99 for supplying the flash lamps FL with power, the gas valves 82, 87, and 473 for supplying and exhausting the process gas to/from the chamber 6, the flow rate regulating valves 85 and 475, the gate valve 185 for opening and closing the transport opening 66, a plate power supply 98 for supplying zones 711 to 716 of the hot plate 71 with power, the gas exhaust pump 474, and the like are electrically connected. The CPU 31 of the controller 3 executes the control software stored in the magnetic disk 34 to control these operation mechanisms, to thereby allow the heat treatment on the semiconductor wafer W to proceed.

Further, to the bus line 39, a display part 35 and an input part 36 are also electrically connected. The display part 35 includes, e.g., a liquid crystal display (LCD) and the like and displays various pieces of information such as a processing result, details of a recipe and the like. The input part 36 includes, e.g., a keyboard, a mouse and the like and receives inputs such as commands, parameters and the like. An operator of this apparatus can input commands, parameters and the like by using the input part 36 while checking the contents displayed on the display part 35. Combining the display part 35 and the input part 36, a touch panel may be used.

The heat treatment apparatus 1 further comprises, in addition to the above constituent elements, various cooling mechanisms to prevent an excessive temperature rise in the chamber 6 and in the lamp house 5 due to heat energy generated by the flash lamps FL and the hot plate 71 during the heat treatment on the semiconductor wafer W. For example, a water cooled tube (not shown) is provided on the chamber side portion 63 and the chamber bottom portion 62 of the chamber 6. The lamp house 5 forms an air cooling structure in which a gas supply pipe 55 and an exhaust pipe 56 are provided to thereby form a gas flow therein and to exhaust heat (see FIGS. 13 and 16). Air is supplied also to a gap between the chamber window 61 and the lamp light radiating window 53, to thereby cool the lamp house 5 and the chamber window 61.

Figure 18:
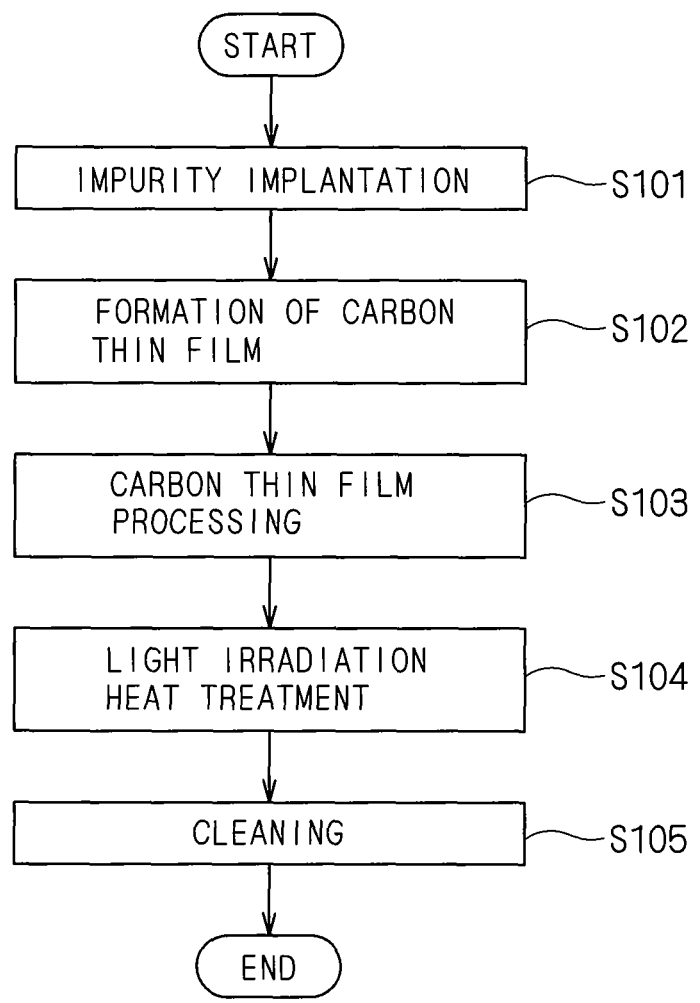
FIG. 18 is a flowchart showing part of an operation flow of processing a semiconductor wafer in accordance with the second preferred embodiment.

Now, a procedure for processing a semiconductor wafer W will be discussed. FIG. 18 is a flowchart showing part of an operation flow for processing the semiconductor wafer W in accordance with the second preferred embodiment. First, patterns are formed on a surface of the silicon substrate 11 (see FIG. 20) by using a photolithography technique and impurities (ions) such as boron (B) or arsenic (As) are implanted into a source/drain region (Step S101). The impurity implantation is performed by ion implantation.

Subsequently, a carbon (C) thin film 12 is formed on the surface of the silicon substrate 11 implanted with the impurities (Step S102). For formation of the carbon thin film 12, various well-known techniques may be adopted. For example, the carbon thin film 12 may be formed by depositing carbon through plasma deposition. FIG. 20 is a cross section of a semiconductor wafer W immediately after the carbon thin film 12 is formed on the surface of the silicon substrate 11. In the second preferred embodiment, on the surface of the silicon substrate 11 implanted with the impurities by ion implantation, the amorphous carbon thin film 12 is deposited and formed by plasma deposition. The film thickness of the thin film 12 immediately after being deposited by plasma deposition is generally uniform in the plane of the silicon substrate 11, and in the second preferred embodiment, the film thickness (the initial value of the film thickness) of the amorphous carbon thin film 12 deposited on the surface of the silicon substrate 11 is 100 nm or more. As shown in FIG. 20, the carbon thin film 12 is formed, slightly getting round to the side end portion of the silicon substrate 11.

Next, after the semiconductor wafer W with the carbon thin film 12 deposited thereon is loaded into the heat treatment apparatus 1, the carbon thin film 12 is processed (Step S103), and the light irradiation heat treatment is performed on the semiconductor wafer W (Step S104). The carbon thin film processing and the light irradiation heat treatment will be discussed later in more detail.

After the light irradiation heat treatment is finished by the heat treatment apparatus 1, cleaning of the semiconductor wafer W is performed (Step S105). This cleaning process includes so-called SPM cleaning (using a mixture of sulfuric acid and oxygenated water) and APM cleaning (using a mixture of aqueous ammonia and oxygenated water). By performing this cleaning process, the carbon thin film 12 is completely removed from the surface of the silicon substrate 11.

Figure 19:
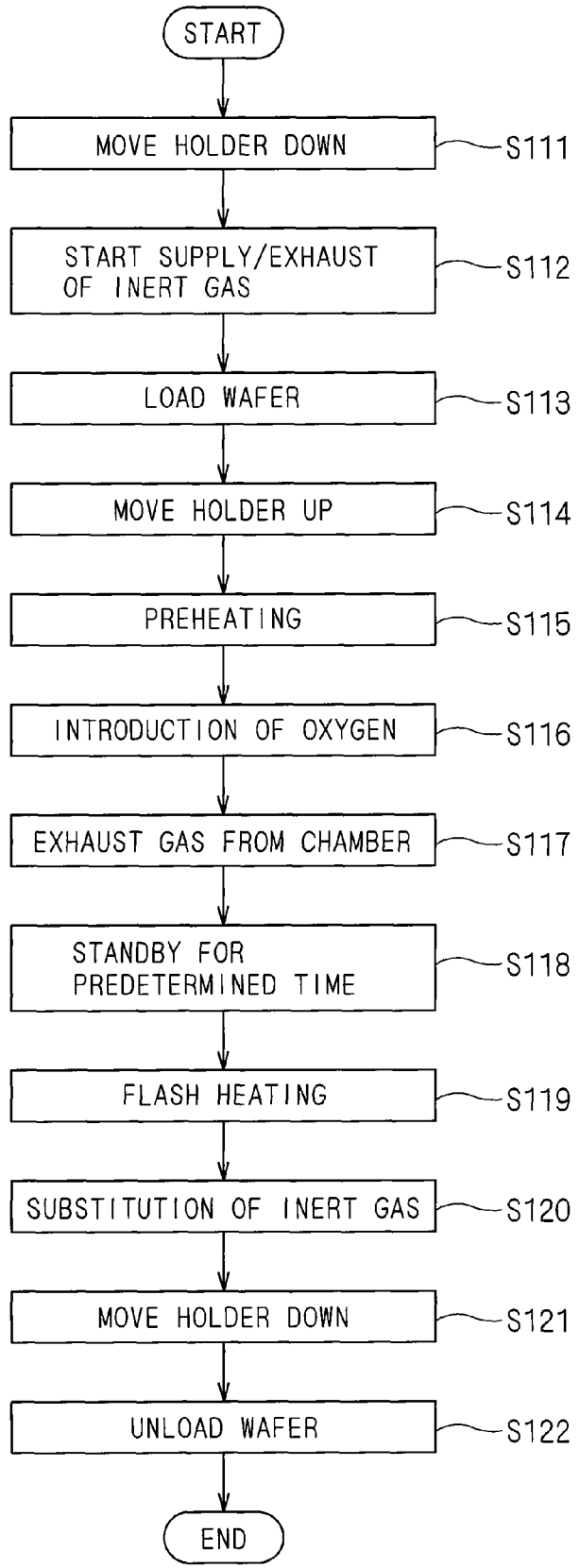
FIG. 19 is a flowchart showing process steps for processing the semiconductor wafer in the heat treatment apparatus in accordance with the second preferred embodiment.

FIG. 19 is a flowchart showing process steps for processing the semiconductor wafer W in the heat treatment apparatus 1 in accordance with the second preferred embodiment. In the second preferred embodiment, the heat treatment apparatus 1 performs both the processing of the carbon thin film 12 and the subsequent light irradiation heat treatment. The procedure of FIG. 19 for processing the semiconductor wafer W is carried out by the controller 3 controlling the operation mechanisms of the heat treatment apparatus 1.

Figure 16:
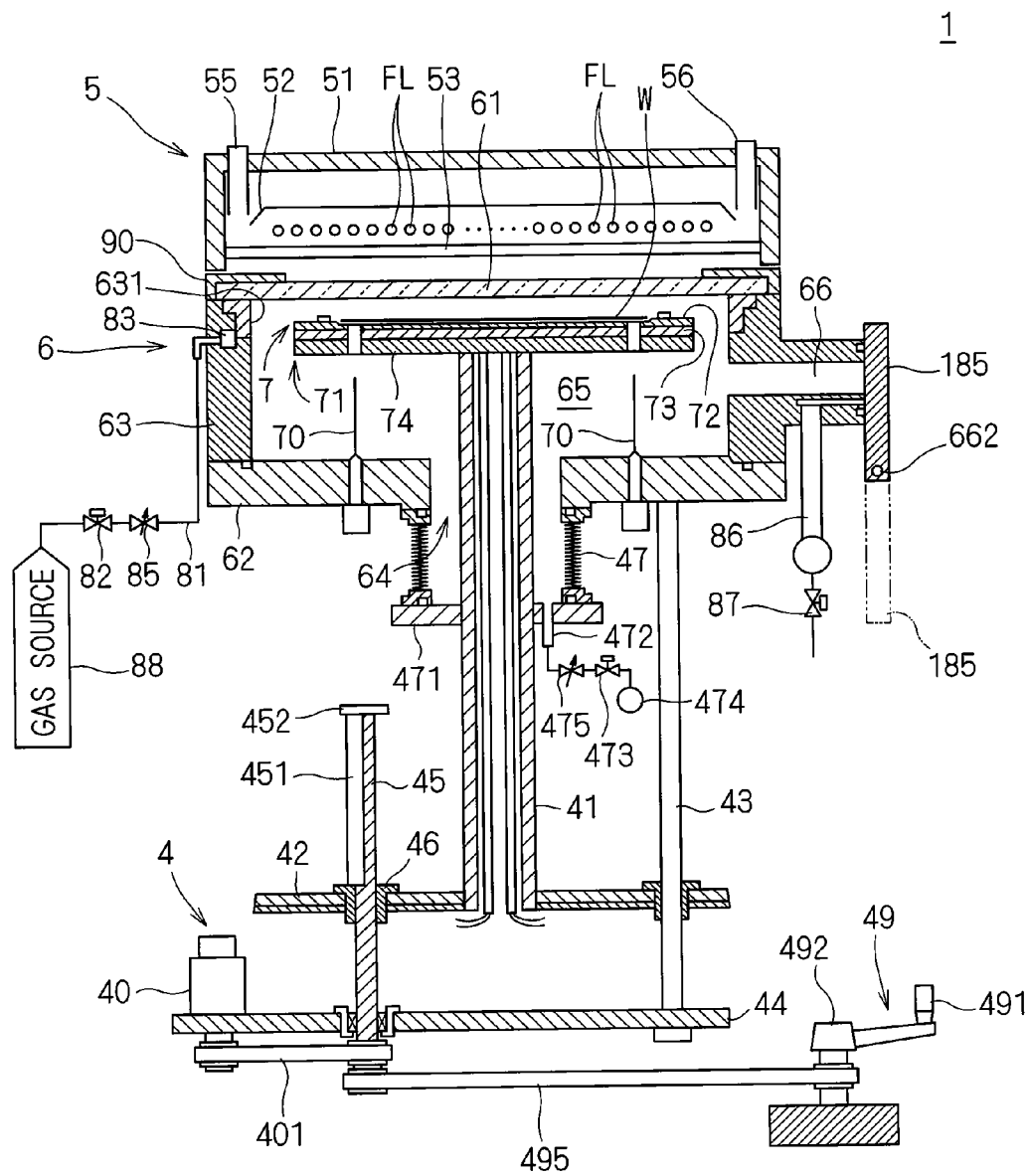
FIG. 16 is another longitudinal section showing the configuration of the heat treatment apparatus of FIG. 13.

First, the holder 7 moves down from the processing position shown in FIG. 16 to the transfer position shown in FIG. 13 (Step S111). The "processing position" is a position where the holder 7 is located when the semiconductor wafer W is irradiated with light from the flash lamps FL, which is the position of the holder 7 in the chamber 6 shown in FIG. 16. The "transfer position" is a position where the holder 7 is located when the semiconductor wafer W is loaded or unloaded into/from the chamber 6, which is the position of the holder 7 in the chamber 6 shown in FIG. 13. The reference position of the holder 7 in the heat treatment apparatus 1 is the processing position. Before the processing, the holder 7 is located at the processing position, and when the processing starts, the holder 7 moves down to the transfer position.

The holder 7 moves up and down relative to the support pins 70 fixed to the chamber 6. As shown in FIG. 13, moving down to the transfer position, the holder 7 comes close to the chamber bottom portion 62 and the respective tips of the support pins 70 penetrate the holder 7 and protrude over the holder 7.

Next, after the holder 7 moves down to the transfer position, the gas valve 82 is opened and an inert gas (nitrogen gas in this preferred embodiment) is thereby supplied into the heat treatment space 65 of the chamber 6 from the gas source 88. At the same time, the gas valves 87 and 473 are opened and the gas is thereby exhausted from the heat treatment space 65 (Step S112). The nitrogen gas supplied from the gas outlet 89 into the chamber 6 flows downwardly toward the bottom opening 64 located at the center of the chamber bottom portion 62 in the heat treatment space 65 and is exhausted through the gas exhaust outlet 472 to the outside of the chamber 6. Part of the nitrogen gas supplied into the chamber 6 is exhausted also from the outlet passage 86

Subsequently, the gate valve 185 is opened to open the transport opening 66, and the semiconductor wafer W with the carbon thin film 12 formed on its surface is loaded into the chamber 6 through the transport opening 66 by a transfer robot provided outside this apparatus and placed on the plurality of support pins 70 (Step S113). After the semiconductor wafer W is loaded into the chamber 6, the transport opening 66 is closed by the gate valve 185. Then, the holder elevating mechanism 4 moves the holder 7 from the transfer position up to the processing position near the chamber window 61 (Step S114). In the course of moving the holder 7 up from the transfer position, the semiconductor wafer W is passed from the support pins 70 to the susceptor 72 of the holder 7 and placed on the upper surface of the susceptor 72 to be held thereon. When the holder 7 moves up to the processing position, the semiconductor wafer W held by the susceptor 72 is also held at the processing position. The semiconductor wafer W held at the processing position is located a little above the gas outlet 89.

Each of the six zones 711 to 716 of the hot plate 71 is already heated up to a predetermined temperature by the heater (the resistance heating wires 76) which is individually provided within the zone (between the upper plate 73 and the lower plate 74). The holder 7 is moved up to the processing position and the semiconductor wafer W comes into contact with the holder 7, whereby the semiconductor wafer W is preheated by the heaters incorporated in the hot plate 71 and the temperature thereof increases gradually (Step S115).

The preheating of the semiconductor wafer W increases the temperature of the semiconductor wafer W up to a preheating temperature T1 which is set in advance. The preheating temperature T1 is set ranging from about 200° C. to about 600° C., preferably from about 350° C. to about 550° C. (500° C. in the second preferred embodiment), at which there is no apprehension that the impurities implanted in the semiconductor wafer W might be diffused by heat. The distance between the holder 7 and the chamber window 61 is arbitrarily adjustable by controlling the amount of rotation of the motor 40 of the holder elevating mechanism 4.

Concurrently with the preheating of the semiconductor wafer W performed at the processing position, oxygen gas is introduced into the heat treatment space 65 of the chamber 6 (Step S116). Specifically, the oxygen gas is supplied into the heat treatment space 65 from the gas source 88 through the gas inlet passage 81. At that time, only the oxygen gas may be supplied or a mixed gas of nitrogen gas and oxygen gas may be supplied. The flow rate of the oxygen gas to be supplied into the heat treatment space 65 from the gas source 88 is controlled by the controller 3 controlling the flow rate regulating valve 85.

While the oxygen gas is supplied into the heat treatment space 65, the atmosphere is continuously exhausted from the chamber 6 (Step S117). Specifically, the gas valve 473 is opened to exhaust the gas from the heat treatment space 65 through the gas exhaust outlet 472. The flow rate of the gas to be exhausted through the gas exhaust outlet 472 is controlled by the controller 3 controlling the flow rate regulating valve 475. Part of the atmosphere in the chamber 6 is exhausted also through the outlet passage 86. The flow rate of the gas to be exhausted through the gas exhaust outlet 472 is significantly larger than the flow rate of the gas to be exhausted through the outlet passage 86.

FIG. 21 is a schematic view showing an airflow formed in the chamber 6. The gas outlet 89 is a ring-shaped slit formed on the chamber side portion 63 a little below the holder 7 located at the processing position (exactly, between the chamber side portion 63 and the ring 631) along the horizontal direction. Accordingly, the gas outlet 89 is so formed in a slit shape as to surround the semiconductor wafer W held by the holder 7 at the processing position, which allows uniform supply of gas containing the oxygen gas from around the semiconductor wafer W. On the other hand, the atmosphere in the chamber 6 is exhausted from the gas exhaust outlet 472 through the center of the chamber bottom portion 62, i.e., the bottom opening 64 located immediately below near the center of the holder 7. Therefore, the atmosphere in the chamber 6 is exhausted from below the semiconductor wafer W held by the holder 7 located at the processing position.

The above-discussed supply/exhaustion of gas causes such an airflow containing oxygen gas as shown in FIG. 21 inside the chamber 6. Most of the airflow containing the oxygen gas discharged from the slit-like gas outlet 89 flows from the underside of the holder 7 located at the processing position toward the bottom opening 64, but some of the airflow also flows to the upper side of the holder 7 (the front surface side of the semiconductor wafer W). Since there is a negative pressure around the bottom opening 64 inside the chamber 6, the airflow flowing to the upper side of the holder 7 also passes by the side of the holder 7 and flows toward the bottom opening 64 in the end. Consequently, the airflow containing the oxygen gas continues to be supplied to the peripheral portion of the semiconductor wafer W to some degree but hardly reaches near the central portion. In other words, more oxygen gas is supplied to the peripheral portion of the semiconductor wafer W held by the holder 7 located at the processing position than to the central portion thereof.

When the oxygen gas is supplied to the surface of the semiconductor wafer W of which the temperature is raised to a preheating temperature T1, the carbon of the thin film 12 reacts with oxygen to produce carbon dioxide ($CO_2$) or carbon monoxide (CO). The carbon of the thin film 12 is thus vaporized, being consumed, and the film thickness of the thin film 12 decreases. In other words, the carbon thin film 12 is etched by supplying the oxygen gas to the preheated semiconductor wafer W. Since the produced oxide of carbon is gas, the gas is exhausted together with the atmosphere in the chamber 6 through the gas exhaust outlet 472 and the outlet passage 86 to the outside of the heat treatment apparatus 1.

At that time, since more oxygen gas is supplied to the peripheral portion of the semiconductor wafer W than to the central portion thereof, the consumption rate of carbon (i.e., the etching rate of the thin film 12) gradually becomes larger in the peripheral portion than in the central portion. As a result, performed is a processing by which the amorphous carbon thin film 12 deposited on the surface of the silicon substrate 11 gradually becomes thinner from its central portion toward its peripheral portion continuously (in an analog manner). This is a carbon thin film processing in Step S103 of FIG. 18.

There needs a standby for a predetermined time in the state where the oxygen gas is supplied to the preheated semiconductor wafer W held by the holder 7 located at the processing position as discussed above (Step S118). The standby time depends on the preheating temperature T1 and has to become longer as the preheating temperature T1 becomes lower. In the second preferred embodiment, the preheating temperature T1 is 500° C. and in this case, the standby time is two to three minutes. This allows a processing by which the carbon thin film 12 gradually becomes thinner continuously from its central portion toward its peripheral portion to proceed, and the difference in the film thickness between the central portion of the thin film 12 and the peripheral portion thereof becomes a predetermined value or more.

FIG. 22 is a cross section of the semiconductor wafer W after the carbon thin film 12 is processed. By supplying more oxygen gas to the surface of the preheated semiconductor wafer W in its peripheral portion than to its central portion, the processing by which the thin film 12 becomes thinner from its central portion toward its peripheral portion is performed and on the surface of the silicon substrate 11, formed is the thin film 12 (like a convex lens) which gradually becomes thinner continuously from its central portion toward its peripheral portion. At the point of time after a predetermined standby time has elapsed in Step S118, the processing is performed so that the difference td between the film thickness tc of the central portion of the carbon thin film 12 and the film thickness te of the peripheral portion thereof may be not less than 8 nm and not more than 30 nm. In the second preferred embodiment, the film thickness tc of the central portion of the thin film 12 is about 80 nm and the film thickness te of the peripheral portion thereof is about 70 nm.

At the point of time after a predetermined standby time has elapsed in Step S118, the flash light is emitted from the flash lamps FL of the lamp house 5 toward the semiconductor wafer W under the control of the controller 3 in the state where the holder 7 is located at the processing position (Step S119). At that time, part of the flash light emitted from the flash lamps FL travels directly to the holder 7 inside the chamber 6. The remainder of the flash light is reflected by the reflector 52, and the reflected light travels to the inside of the chamber 6. With such emission of the flash light, the flash heating is performed on the semiconductor wafer W. The flash heating, which is achieved by emission of the flash light from the flash lamps FL, can raise the surface temperature of the semiconductor wafer W in a short time.

Specifically, the flash light emitted from the flash lamps FL of the lamp house 5 is an extremely short and intense flash of light emitted for a period of time not shorter than 0.1 milliseconds and not longer than 100 milliseconds because the previously stored electrostatic energy is converted into such an ultrashort light pulse. The surface temperature of the semiconductor wafer W (exactly, the surface temperature of the carbon thin film 12) subjected to the flash heating by emission of flash light from the flash lamps FL instantaneously rises to a treatment temperature T2, and after the impurities implanted in the semiconductor wafer W are activated, the surface temperature falls quickly. In the heat treatment apparatus 1, since the surface temperature of the semiconductor wafer W can be increased and decreased in an extremely short time, activation of the impurities implanted in the semiconductor wafer W can be achieved while the diffusion of the impurities due to heat is suppressed. Since the time period required for the activation of the impurities is extremely short as compared with the time period required for the thermal diffusion of the impurities, the activation is completed even in a short time ranging from about 0.1 to about 100 milliseconds during which no diffusion occurs. This is a light irradiation heat treatment in Step S104 of FIG. 18.

On the surface of the semiconductor wafer W to be treated, the carbon thin film 12 is formed. As the film thickness of the carbon thin film 12 becomes larger, the surface reflectance of the semiconductor wafer W decreases, and when the film thickness is 70 nm, the surface reflectance is about 60%. The decrease in the surface reflectance means the increase in the absorptivity of flash light in the semiconductor wafer W, and more specifically, it means the increase in the absorptivity of flash light in the carbon thin film 12. The spectral distribution of radiation of flash light from the xenon flash lamps FL ranges from ultraviolet to near-infrared regions and the flash light hardly passes through the silicon substrate 11.

The decrease in the surface reflectance of the semiconductor wafer W with the increase in the film thickness of the carbon thin film 12 is caused by the increase in the absorptivity of flash light in the carbon thin film 12 with the increase in the film thickness thereof. Specifically, when the carbon thin film 12 becomes thick to some degree or more, part of the emitted flash light is absorbed by the thin film 12. The absorptivity becomes larger as the film thickness of the thin film 12 becomes larger. Heat is generated on the surface of the carbon thin film 12 which has absorbed the flash light and the heat is transferred to the surface of the silicon substrate 11.

Thus, the carbon thin film 12 having a given film thickness or more functions as a light absorption film to increase the absorptivity of flash light in the semiconductor wafer W. As a result of increasing the absorptivity of flash light in the semiconductor wafer W, the attained surface temperature of the semiconductor wafer W during the irradiation with flash light (strictly describing, the attained surface temperature of the surface of the silicon substrate 11 implanted with the impurities) increases as compared with that in the case where no thin film is formed, and this allows better activation of the impurities to be achieved.

Especially, in the second preferred embodiment, the thin film 12 is formed so that its film thickness may gradually become smaller continuously from its central portion toward its peripheral portion. The absorptivity of flash light accordingly becomes higher in the central portion of the semiconductor wafer W than in the peripheral portion thereof. On the other hand, as discussed above, the intensity distribution of the flash light in the plane of the semiconductor wafer W during the irradiation with flash light is not completely uniform, and there is a tendency that the light intensity becomes higher in the peripheral portion of the semiconductor wafer W than in the central portion thereof due to the effect of reflection on the chamber side portion 63 and the like. In other words, in the peripheral portion of the semiconductor wafer W where the light intensity becomes higher during the irradiation with flash light, the absorptivity of flash light is lower, and in the central portion of the semiconductor wafer W where the light intensity becomes lower, to absorptivity of flash light is high. As a result, the degree of increase in the temperature of the thin film 12 serving as the light absorption film is generally uniform in the plane of the semiconductor wafer W, and the inplane temperature distribution of the semiconductor wafer W during the irradiation with flash light can be made uniform. Thus, by forming the thin film 12 so that its film thickness gradually becomes smaller continuously from the central portion of the semiconductor wafer W toward the peripheral portion thereof, it is possible to raise the surface temperature of the semiconductor wafer W uniformly to be still higher and achieve better activation of the impurities, and the sheet resistance value can be also uniformly decreased.

The reason why the difference td between the film thickness tc of the central portion of the thin film 12 and the film thickness to of the peripheral portion thereof is set to not less than 8 nm and not more than 30 nm is as follows. If the difference td in the film thickness is less than 8 nm, such an effect of achieving higher absorptivity of flash light in the central portion than in the peripheral portion as discussed above is hardly produced, and the temperature of the peripheral portion of the semiconductor wafer W which is irradiated with the flash light of higher intensity becomes higher than that of the central portion thereof. On the other hand, if the difference td in the film thickness is more than 30 nm, the absorptivity of flash light in the central portion becomes too high as compared with that in the peripheral portion, and the temperature of the central portion of the semiconductor wafer W during the irradiation with flash light becomes higher than that of the peripheral portion thereof. In other words, if the difference td in the film thickness between the central portion of the thin film 12 and the peripheral portion thereof is out of the range not less than 8 nm and not more than 30 nm, it becomes difficult to uniformize the inplane temperature distribution of the semiconductor wafer W during the irradiation with flash light.

The flash light emitted from the flash lamps FL is once absorbed by the carbon thin film 12 and this causes heat in the thin film 12, and then the heat is transferred to the surface of the silicon substrate 11. Therefore, even if there is variation of the absorptivity in the surface of the silicon substrate 11 due to formation of patterns, the variation of the absorptivity can be eased as compared with the case where no thin film is formed, and the surface of the silicon substrate 11 implanted with the impurities is thereby uniformly heated.

Also when the flash light is emitted from the flash lamps FL, the oxygen gas is supplied into the chamber 6 from the gas outlet 89 while the atmosphere continues to be exhausted from the chamber 6 through the gas exhaust outlet 472. Therefore, the carbon of the thin film 12 heated by irradiation with flash light reacts with oxygen to produce carbon dioxide ($CO_2$) or carbon monoxide (CO). The carbon of the thin film 12 is thus vaporized, being consumed, and the film thickness of the thin film 12 decreases. In other words, the carbon thin film 12 is removed by introduction of oxygen into the chamber 6 while serving as a light absorption film during the irradiation with flash light. Since the produced oxide of carbon is gas, the gas is exhausted together with the atmosphere in the chamber 6 through the gas exhaust outlet 472 and the outlet passage 86 to the outside of the heat treatment apparatus 1.

After the lapse of predetermined time (several seconds) from the end of the flash heating, nitrogen gas is supplied again into the heat treatment space 65 from the gas source 88 while the gas containing the oxygen gas is exhausted from the heat treatment space 65 through the gas exhaust outlet 472 and the outlet passage 86. The atmosphere in the chamber 6 is thereby substituted with the nitrogen gas (Step S120).

Then, the holder 7 is moved down again to the transfer position shown in FIG. 13 by the holder elevating mechanism 4, and the semiconductor wafer W is passed from the holder 7 to the support pins 70 (Step S121). Subsequently, the gate valve 185 opens the transport opening 66 having been closed, and the transfer robot provided outside this apparatus unloads the semiconductor wafer W rested on the support pins 70. Thus, the flash heat treatment (annealing process) on the semiconductor wafer W in the heat treatment apparatus 1 is completed (Step S122).

As discussed above, in the second preferred embodiment, formation of the carbon thin film 12 on the surface of the semiconductor wafer W allows the carbon thin film 12 to absorb the flash light. Absorbing the flash light causes the temperature of the carbon thin film 12 to rise, and it is thereby possible to increase the surface temperature of the silicon substrate 11 implanted with the impurities to be still higher and decrease the sheet resistance value as compared with the case where no thin film is formed.

Particularly, in the second preferred embodiment, by supplying more oxygen gas to the peripheral portion of the semiconductor wafer W than to the central portion thereof while preheating the semiconductor wafer W, the processing by which the carbon thin film 12 becomes thinner from its central portion toward its peripheral portion is performed. Therefore, on the surface of the semiconductor wafer W, formed is the thin film 12 which gradually becomes thinner continuously from its central portion where the intensity of flash light is lower toward its peripheral portion where the intensity of flash light is higher. This compensates for the variation in the intensity distribution of the flash light and uniformizes the inplane temperature distribution of the semiconductor wafer W during the irradiation with the flash light. Further, the surface temperature of the semiconductor wafer W can be uniformly increased to be still higher and the sheet resistance value can be decreased. By uniformizing the inplane temperature distribution of the semiconductor wafer W during the irradiation with the flash light, it is possible to suppress a break in the semiconductor wafer W. Since the thin film 12 gradually becomes thinner, the absorptivity of light in the plane of the semiconductor wafer W does not sharply change and this makes the inplane temperature distribution of the semiconductor wafer W more uniform.

Since the semiconductor wafer W with carbon thin film 12 formed thereon is irradiated with the flash light while the oxygen gas is supplied into the chamber 6, the carbon of the heated thin film 12 is oxidized and thus vaporized, thereby being consumed. This allows the removal of the carbon thin film 12 to proceed during the flash heating, and the remaining film of carbon can be removed only by the normal SPM cleaning and APM cleaning in the subsequent cleaning process (Step S105 of FIG. 18). If the flash light is emitted in the atmosphere of inert gas such as nitrogen gas inside the chamber 6, since the carbon of the thin film 12 is not consumed, the original film thickness is generally maintained even after the flash heating. In this case, the thin film 12 is not fully removed only by the normal SPM cleaning and APM cleaning and the ashing process is additionally needed before the cleaning process of Step S105. As shown in the second preferred embodiment, if the irradiation with the flash light is performed while the oxygen gas is supplied into the chamber 6, the removal of the thin film 12 can be performed concurrently with the flash heating, and therefore, no ashing process is needed and the remaining film can be reliably removed only by the normal cleaning process. The carbon thin film 12 is not entirely vaporized during the emission of flash light, and the remaining film also serves as an antioxidizing film for the surface of the silicon substrate 11.

<Variations>

Though the preferred embodiments of the present invention have been discussed above, the present invention allows various variations other than the above-discussed embodiments without departing from the scope of the invention. For example, though the amorphous carbon thin film 12 is formed on the surface of the silicon substrate 11 implanted with impurities in the above preferred embodiments, a thin film of carbon having a crystal structure (e.g., graphite), instead of amorphous carbon, may be formed. Even if the thin film 12 of carbon having a crystal structure is formed, the same effect as discussed in the above preferred embodiments can be produced. When the thin film 12 is made of amorphous carbon, however, the thin film 12 is easily oxidized during the flash heating and the removal of the thin film 12 can easily proceed.

The thin film 12 may be formed of a carbon compound. One of carbon compounds suitable for the thin film 12 serving as a light absorption film is especially an organic compound, and a favorable one is a compound containing carbon and hydrogen, or containing carbon, hydrogen, and oxygen. In other words, the thin film 12 has only to be formed of carbon or a carbon compound on the surface of the silicon substrate 11 implanted with impurities.

Though the film thickness t of the amorphous carbon thin film 12 formed on the surface of the silicon substrate 11 is 70 nm in the first preferred embodiment, the film thickness t is not limited to this, but only if the carbon or carbon compound thin film 12 having a film thickness t of at least 20 nm or more is formed, the thin film 12 can produce the effect as a light absorption film. Since the absorptivity of flash light in the thin film 12 increases as the film thickness of the thin film 12 becomes larger, however, in order to absorb more flash light and raise the surface temperature of the silicon substrate 11 more effectively, it is desirable that the film thickness t of the thin film 12 should be 70 nm or more. On the other hand, if the film thickness t of the thin film 12 becomes larger to exceed 280 nm, the thin film 12 produces no significant change in the effect of raising the temperature as a light absorption film and there arises a possibility instead that the thickness of the remaining film after the flash heating becomes larger and the film cannot fully removed only by the subsequent cleaning process. Therefore, the favorable film thickness t of the carbon or carbon compound thin film 12 formed on the surface of the silicon substrate 11 is not less than 70 nm and not more than 280 nm.

Though the oxygen concentration in the chamber 6 during the irradiation with flash light is set to 90% or more in the first preferred embodiment, the oxygen concentration is not limited to this, but only if even a few amount of oxygen gas is present around the semiconductor wafer W during the irradiation with flash light, the effect of oxidizing the carbon of the thin film 12 and removing the thin film 12 can be produced. In order to produce both the effect of fully removing the thin film 12 and the effect of cancelling the nonuniformity in the inplane temperature distribution due to the variation in the intensity distribution of the flash light, however, it is desirable that the oxygen concentration in the chamber 6 during the irradiation with flash light should be higher, and it is particularly preferable that the oxygen concentration should be set to 90% or more. If the oxygen concentration in the chamber 6 is 90% or more, it is possible to prevent the deposition of carbon-based contaminants on the inside of the chamber 6 during the irradiation with flash light.

On the other hand, in terms of obtaining a lower sheet resistance value, it is desirable that the oxygen concentration in the chamber 6 during the irradiation with flash light should be lower. In order to produce all the effects of effectively removing the thin film 12, of preventing the deposition of contaminants on the inside of the chamber 6, and of cancelling the nonuniformity in the inplane temperature distribution, however, it is desirable that the oxygen concentration in the chamber 6 during the irradiation with flash light should be higher than the oxygen concentration in the atmosphere, and specifically the oxygen concentration should be not lower than 21%. Therefore, the oxygen concentration in the chamber 6 during the irradiation with flash light may be any value not lower than 21% and not higher than 100% in consideration of the required sheet resistance value, the uniformity in the inplane temperature distribution, the effect of removing the thin film 12, and the like. In order only to achieve a lower sheet resistance value, however, there may be a case where the semiconductor wafer W with the carbon thin film 12 formed on its surface is irradiated with flash light without introducing oxygen gas into the chamber 6 (for example, with nitrogen atmosphere inside the chamber 6).

In the first preferred embodiment, the timing at which the oxygen gas is introduced into the chamber 6 is not limited to the exemplary one shown in FIG. 8 but the oxygen gas may be introduced before the preheating. In other words, only if the oxygen concentration in the chamber 6 during the irradiation with flash light takes a predetermined value, the oxygen gas may be introduced into the chamber 6 at any timing.

Though the film thickness of the thin film 12 becomes smaller from its central portion toward its peripheral portion in the second preferred embodiment, the film thickness distribution is not limited to this but the distribution of the film thickness of the thin film 12 has only to be such one as to compensate for the variation in the intensity distribution of the flash light. If there is an intensity distribution in which the light intensity becomes higher in the central portion of the semiconductor wafer W than in the peripheral portion thereof, contrary to the second preferred embodiment, the film thickness of the thin film 12 has only to become smaller from its peripheral portion toward its central portion (like a concave lens). In other words, such a thin film has only to be formed as to compensate for the variation in the intensity distribution of the flash light in the plane of the semiconductor wafer W during the irradiation with the flash light, and more specifically, as to have a nonuniform film thickness distribution in which the film thickness becomes smaller at the positions where the intensity of flash light is higher.

Though the processing by which the carbon thin film 12 becomes thinner from its central portion toward its peripheral portion is performed by supplying more oxygen gas to the peripheral portion of the semiconductor wafer W than to the central portion thereof while preheating the semiconductor wafer W in the second preferred embodiment, the processing of the carbon thin film 12 is not limited to this. There may be a case, for example, where a plurality of flash lamps having different diameters are arranged concentrically in the lamp house 5 and while oxygen gas is supplied to the surface of the semiconductor wafer W, only the peripheral portion of the semiconductor wafer W is irradiated with less intense flash light, whereby a difference in the film thickness is produced. In this case, after the irradiation with the less intense flash light for processing the carbon thin film 12, the irradiation with flash light is performed, like in Step S119 of FIG. 19, to activate the impurities. Since the hot plate 71 of the holder 7 for preheating the semiconductor wafer W is divided into a plurality of zones arranged concentrically (see FIG. 4), there may be another case where while oxygen gas is supplied to the surface of the semiconductor wafer W, preheating is performed so that the temperature of the peripheral portion of the semiconductor wafer W becomes higher than that of the central portion thereof, to thereby produce a difference in the film thickness. Specifically, in the preheating, the controller 3 controls the plate power supply 98 so that the temperature of the zone 712 may become higher than that of the zone 711 and the respective temperatures of the zones 713 to 716 may become higher than that of the zone 712.

In the second preferred embodiment, there may be still another case where the carbon thin film processing is additionally performed before the semiconductor wafer W with the carbon thin film 12 deposited thereon (the wafer shown in FIG. 20) is loaded into the heat treatment apparatus 1. For example, the semiconductor wafer W with the carbon thin film 12 deposited thereon is loaded into an apparatus for performing bevel etching and only the peripheral portion of the semiconductor wafer W is etched with hydrofluoric acid or the like. Alternatively, in the process step of performing plasma deposition on the surface of the silicon substrate 11, a thin film 12 may be deposited so that its film thickness gradually becomes smaller from the central portion of the semiconductor wafer W toward the peripheral portion thereof.

In the second preferred embodiment, the material for the thin film 12 to be formed on the surface of the silicon substrate 11 is not limited to carbon but any material having the physical properties of absorbing flash light may be used. For example, the thin film 12 may be formed of silicon nitride (SiN)) or may be formed of a metal-based reflection film/absorption film. As the metal-based reflection film, polysilicon+germanium (Ge), polysilicon+arsenic (As), $MgF_2$, $CaF_2$, SiGe, Ge, GaAs, InSb, Cr, Mo, Nb, Zr, Y, Ti, a compound of La and oxygen (O), nitrogen (N), or carbon (C), or AlN may be used. As the metal-based absorption film, $SiO_2$, SiON, or $Si_3N_4$ in which crystallized carbon (C) contains hydrogen (H) or oxygen (O) may be used. Even if the thin film 12 is formed of any one of these materials, when the thin film 12 is formed so that its film thickness may gradually become smaller from the central portion of the semiconductor wafer W toward the peripheral portion thereof, the absorptivity of flash light becomes higher in the central portion of the semiconductor wafer W than in the peripheral portion thereof. As a result, like in the second preferred embodiment, the inplane temperature distribution of the semiconductor wafer W during the irradiation with flash light can be made uniform. If the thin film 12 is formed of silicon nitride or the metal-based reflection film, however, since the processing of the thin film 12 cannot be performed by heating and supply of oxygen gas, it is necessary to perform the processing for producing a difference in the film thickness by bevel etching with hydrofluoric acid or the like before the wafer is loaded into the heat treatment apparatus 1.

In the second preferred embodiment, a plural-layered thin film may be formed on the surface of the silicon substrate 11. FIG. 23 is a cross section of a semiconductor wafer W in which a double-layered thin film is formed on the surface of the silicon substrate 11. On the surface of the silicon substrate 11 implanted with the impurities by ion implantation, a carbon or carbon compound thin film 12a (first thin film) is deposited and formed, like in the second preferred embodiment, and further, a polysilicon thin film 12b (second thin film) of which the film thickness becomes smaller from its central portion toward its peripheral portion is formed. The film thickness processing of polysilicon can be performed by bevel etching with hydrofluoric acid or the like. This also makes the absorptivity of flash light in the central portion of the semiconductor wafer W higher than that in the peripheral portion thereof and uniformize the inplane temperature distribution of the semiconductor wafer W during the irradiation with flash light. Further, during the irradiation with flash light, scattering of carbon-based contaminants from the lower thin film 12a can be suppressed with the upper thin film 12b and this prevents deposition of such contaminants on the structure inside the chamber 6. In FIG. 23, even if the thin film 12b is formed of amorphous silicon or silicon nitride, the same effect can be produced.

Though the lamp house 5 is provided with thirty flash lamps FL in the above preferred embodiments, the number of flash lamps FL is not limited to this but an arbitrary number of flash lamps FL may be provided. The flash lamp FL is not limited to a xenon flash lamp but may be a krypton flash lamp.

Though the semiconductor wafer W is preheated by heat transferred from the holder 7 including the hot plate 71 in the above preferred embodiments, there may be a case where halogen lamps are provided at the bottom of the chamber 6 and the semiconductor wafer W is preheated by irradiation with light emitted from the halogen lamps. In the second preferred embodiment, even if the processing by which the carbon thin film 12 becomes thinner from its central portion toward its peripheral portion is performed by supplying more oxygen gas to the peripheral portion of the semiconductor wafer W than to the central portion thereof while preheating the semiconductor wafer W by irradiation with the light emitted from the halogen lamps, the same effect as discussed above can be produced.

The techniques in accordance with the present invention can be also applied to a glass substrate on which a silicon film is formed.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus for heating a substrate implanted with impurities by irradiating the substrate with flash light, comprising:
    a chamber for housing a substrate in which a carbon or carbon compound thin film is formed on a surface thereof after being implanted with impurities;
    a holding part for holding said substrate in said chamber;
    a flash lamp for emitting flash light to said substrate held by said holding part,
    further comprising an oxygen introduction part for introducing oxygen gas into said chamber; and
    a control part configured to house said substrate in said chamber, and thereafter introduce oxygen gas from said oxygen introduction part into said chamber before emitting the flash light, and then control said flash lamp to emit flash light to said substrate in the oxygen atmosphere.

2. The heat treatment apparatus according to claim 1, wherein said oxygen introduction part sets the oxygen concentration to 90% or more in said chamber at the point of time when flash light is emitted from said flash lamp.

3. The heat treatment apparatus according to claim 2, further comprising a control part for controlling said oxygen introduction part to set the oxygen concentration to 90% or more in said chamber and controlling said flash lamp to emit flash light to the inside of said chamber in which the oxygen concentration is set to 90% or more when no substrate is housed in said chamber.

4. The heat treatment apparatus according to claim 1, wherein the thickness of said thin film is not less than 70 nm and not more than 280 nm.

5. The heat treatment apparatus according to claim 1, wherein the material of said thin film is amorphous carbon.

6. A heat treatment apparatus for heating a substrate implanted with impurities by irradiating the substrate with flash light, comprising:
    a chamber for housing a substrate in which a carbon or carbon compound thin film is formed on a surface thereof after being implanted with impurities;
    a holding part for holding said substrate in said chamber;
    a preheating part for preheating said substrate held by said holding part;
    a flash lamp for emitting flash light to said substrate held by said holding part;
    an oxygen gas supply part for supplying oxygen gas from around said substrate held by said holding part in said chamber;
    an exhaust part for exhausting the atmosphere in said chamber from below said substrate held by said holding part; and
    a control part configured to control said preheating part to heat said substrate held by said holding part, control said oxygen gas supply part to supply oxygen gas while controlling said exhaust part to exhaust the atmosphere from said chamber, to thereby make the film thickness smaller from the central portion of said thin film formed on said surface of said substrate toward the peripheral portion thereof, and then control said flash lamp to emit flash light.

7. The heat treatment apparatus according to claim 6, wherein the difference in the film thickness between the central portion of said thin film and the peripheral portion thereof is not less than 8 nm and not more than 30 nm when flash light is emitted.

* * * * *